US009142576B2

United States Patent
Machida

(10) Patent No.: US 9,142,576 B2
(45) Date of Patent: Sep. 22, 2015

(54) SOLID-STATE IMAGE SENSOR, METHOD FOR THE SAME, AND ELECTRONIC DEVICE

(71) Applicant: Sony Corporation, Tokyo (JP)

(72) Inventor: Takashi Machida, Tokyo (JP)

(73) Assignee: SONY CORPORATION (JP)

( * ) Notice: Subject to any disclaimer, the term of this patent is extended or adjusted under 35 U.S.C. 154(b) by 182 days.

(21) Appl. No.: 14/026,643

(22) Filed: Sep. 13, 2013

(65) Prior Publication Data

US 2014/0084138 A1 Mar. 27, 2014

(30) Foreign Application Priority Data

Sep. 21, 2012 (JP) .................................. 2012-208322

(51) Int. Cl.
| | |
|---|---|
| *H01L 27/146* | (2006.01) |
| *H04N 5/357* | (2011.01) |
| *H04N 5/359* | (2011.01) |
| *H04N 5/3745* | (2011.01) |

(52) U.S. Cl.
CPC .... *H01L 27/14601* (2013.01); *H01L 27/14609* (2013.01); *H04N 5/3575* (2013.01); *H04N 5/3591* (2013.01); *H04N 5/37452* (2013.01)

(58) Field of Classification Search
CPC .................. H01L 27/14601; H01L 27/14656; H04N 5/353
USPC ............................... 250/208.1; 257/290–292
See application file for complete search history.

(56) References Cited

U.S. PATENT DOCUMENTS

| 8,901,618 B2 * | 12/2014 | Fukuro et al. ................. 257/229 |
| 8,902,341 B2 * | 12/2014 | Mabuchi ....................... 348/296 |
| 8,934,036 B2 * | 1/2015 | Oike ............................. 348/294 |
| 8,952,432 B2 * | 2/2015 | Oike et al. .................... 257/291 |

FOREIGN PATENT DOCUMENTS

| JP | HEI 01-243675 A | 9/1989 |
| JP | 2004-111590 A | 4/2004 |
| JP | 2004-140149 A | 5/2004 |
| JP | 2009-278241 A | 11/2009 |

* cited by examiner

*Primary Examiner* — Seung C Sohn
(74) *Attorney, Agent, or Firm* — Sheridan Ross P.C.

(57) ABSTRACT

There is provided a solid-state image sensor including a photoelectric conversion part which generates a charge corresponding to received light and accumulates the charge therein, a charge holding part in which before the charge accumulated in the photoelectric conversion part is transferred to a floating diffusion region, the charge is held for a predetermined time, a first transfer gate which transfers the charge accumulated in the photoelectric conversion part to the charge holding part, a second transfer gate which transfers the charge held in the charge holding part to the floating diffusion region, and a charge discharging gate which discharges the charge in the photoelectric conversion part. Before charge accumulation in the photoelectric conversion part for the next frame is started, part of the charge accumulated in the charge holding part is discharged.

9 Claims, 32 Drawing Sheets

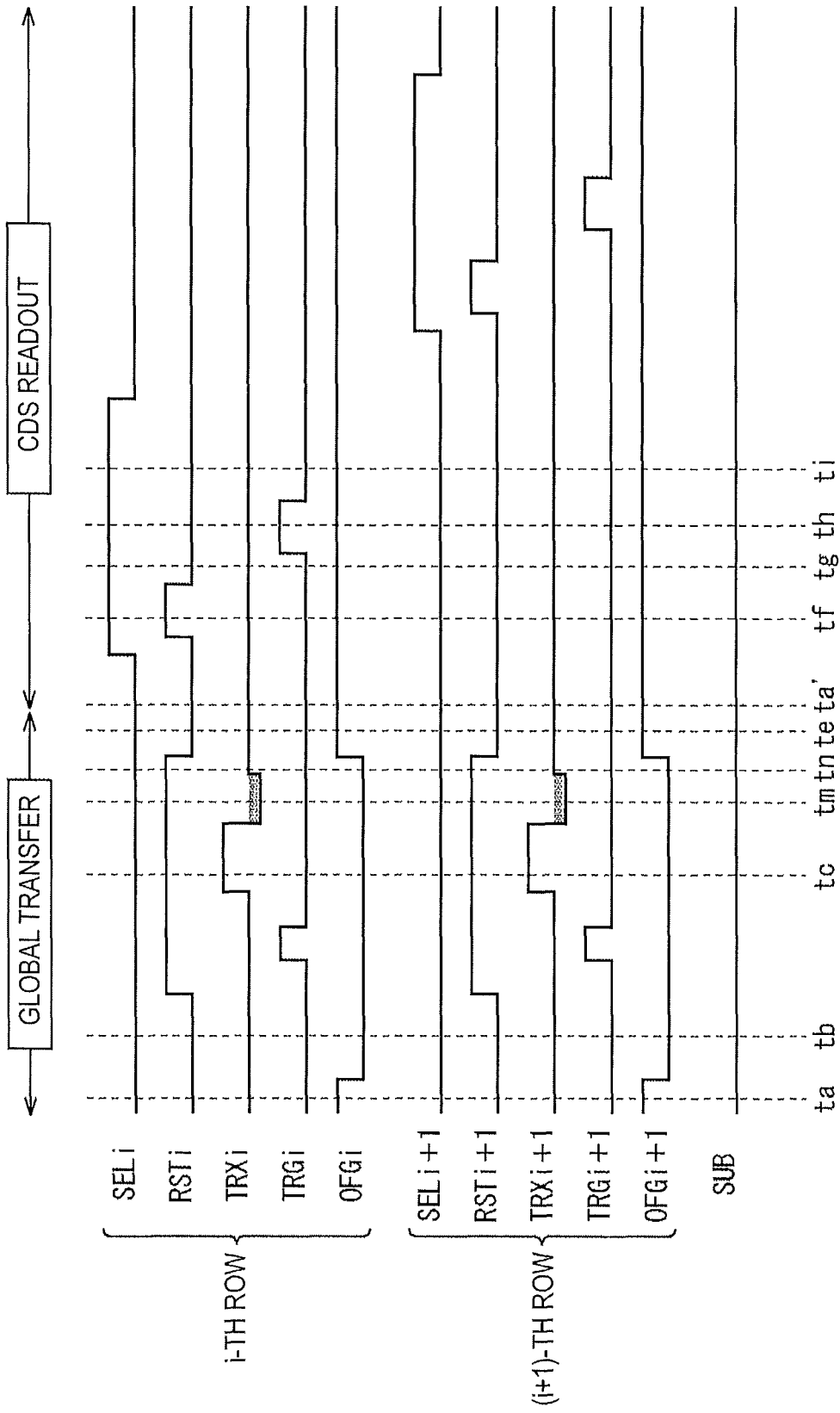

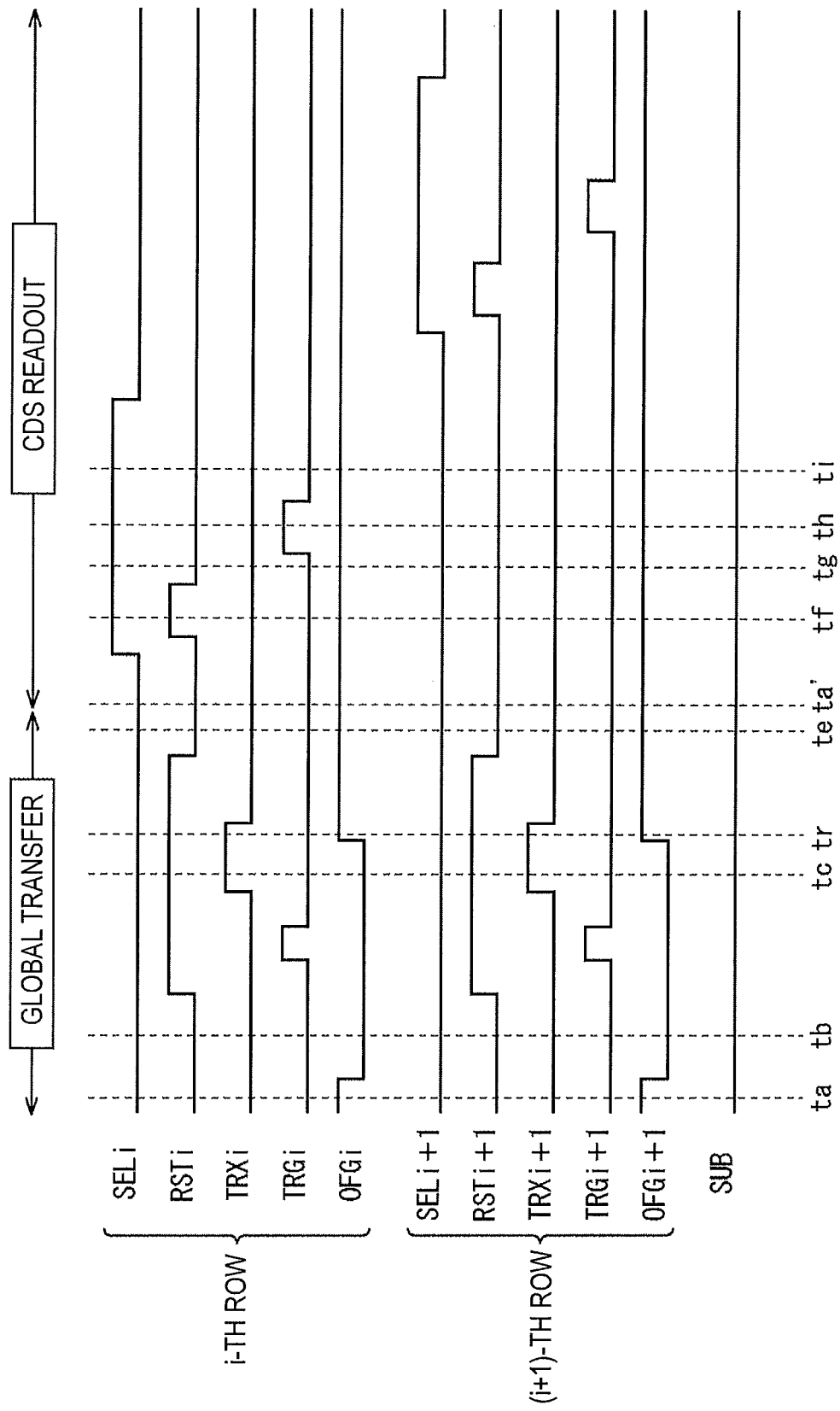

SOLID-STATE IMAGE SENSOR, METHOD FOR THE SAME, AND ELECTRONIC DEVICE

BACKGROUND

The present technology relates to a solid-state image sensor, a method for the same, and an electronic device, and particularly relates to a solid-state image sensor, a method for the same, and an electronic device which make it possible to reduce occurrence of an after-image caused by charge overflow.

A CMOS image sensor, for example, is used as a solid-state imaging device including a solid-state image sensor. The CMOS image sensor reads out, through MOS transistors, a photocharge accumulated in a pn junction capacitor of a photodiode which is a photoelectric transducer. Since the CMOS image sensor executes an operation of reading out the photocharge accumulated in the photodiode in pixel unit, row unit, or the like, it is not possible to provide all of pixels with the same exposure time period during which the photocharge is accumulated. Accordingly, in such a case that a subject is moving, a captured image might have distortion.

Each of unit pixels of the CMOS image sensor includes a photodiode, a transfer gate, a floating diffusion (FD), a reset transistor, an amplification transistor, and a select transistor.

In this unit pixel, the photodiode is a buried photodiode, for example, by forming a P-type layer in a p-type well layer formed on an N-type substrate and by burying an N-type buried layer (N) in the p-type well layer. The transfer gate transfers the charge accumulated in the pn junction of the photodiode to the floating diffusion (FD).

A mechanical shutter method using a mechanical light shielding unit is widely used as one of methods by which global exposure is implemented for a solid-state image sensor. In the global exposure, an image is captured with all the pixels having the same exposure time period. This mechanical light shielding enables the global exposure to be executed in such a manner that all the pixels simultaneously start exposure and simultaneously terminate the exposure.

In the mechanical shutter method, the exposure time is mechanically controlled to thereby provide each pixel with the same time period in which a charge is generated when light enters the photo diode. Then, the mechanical shutter is closed, and the state changes to a state where no photocharge is substantially generated. In this state, signals are read out sequentially.

However, since the mechanical shutter needs the mechanical light shielding unit, it makes downsizing difficult, and the speed at which the mechanism is driven is limited. For this reason, the mechanical shutter method is inferior to an electrical method in concurrency.

Hence, the electrical global exposure is employed. In the electrical global exposure method, a charge discharging operation is firstly executed simultaneously in each pixel, and then the exposure is started. In the charge discharging operation, the buried photodiode is evacuated with the charge accumulated therein. Thereby, the photocharge is accumulated in the pn junction capacitor of the photodiode.

At the time point when the exposure time period ends, the transfer gate is turned ON simultaneously in each pixel to transfer every accumulated photocharge to the floating diffusion (capacitor).

By closing the transfer gate, the photocharge accumulated in the same exposure time period for all the pixels is held in the floating diffusion.

Thereafter, a signal level is sequentially read out to a vertical signal line, and then the floating diffusion is reset to read out a reset level to the vertical signal line.

When the signal indicating the signal reset level is read out, noise of the signal level is removed by using the reset level in signal processing in the subsequent stage (for example, refer to JP H01-243675A or JP 2004-140149A).

In the noise removing processing, the reset level is read out which results from reset operation executed after the signal level is read out. Accordingly, it is not possible to remove kTC noise (thermal noise) in the reset operation, and thus the image quality is deteriorated.

The kTC noise in the reset operation is random noise generated due to reset transistor switching operation in the reset operation. Accordingly, if a level before transferring the charge to the floating diffusion is not used, it is not possible to appropriately remove the noise of the signal level.

Since the charge is transferred to the floating diffusion simultaneously in each pixel, and thus the noise is removed at this time in such a manner that the signal level is read out and thereafter the reset operation is executed again. Accordingly, it is possible to remove noise such as an offset error, but not possible to remove the kTC noise.

As a technique of enabling the aforementioned kTC noise removal, a unit pixel is proposed which, for example, includes a memory part in the pixel besides a floating diffusion. The memory part is designed to temporarily hold the photocharge accumulated in a buried photodiode. The unit pixel is further provided with a transfer gate which transfers the photocharge accumulated in the photodiode to the memory part.

In executing global exposure in unit pixels each including a memory part, an OFG which resets a PD simultaneously in each pixel is firstly turned ON to execute an operation of discharging the charge in the PD.

Thereafter, the OFG is turned off to start the simultaneous exposure, and thereby the generated photocharge is accumulated in the PD.

Upon completion of the exposure, the transfer gate is driven simultaneously in each pixel to transfer the photocharge to the memory part, and then the transfer gate is turned off to hold the charge in the memory part.

After the transfer gate is turned off, the OFG is turned on to prevent a signal from overflowing from the PD into the memory part holding the charge (blooming) and to perform PD resetting for the next frame.

Thereafter, sequential operations are performed to read out a reset level and a signal level from the charge held in the memory part.

The floating diffusion (FD) is firstly reset, and then the reset level is read out.

Subsequently, the charge held in the memory part is transferred to the floating diffusion (FD) to read out the signal level. At this time, reset noise included in the signal level coincides with reset noise read out when the reset level is read out. This enables processing of reducing noise including even the kTC noise.

That is, according to a pixel structure in which a memory part temporarily holding a charge accumulated in a buried photo diode is provided besides a floating diffusion region, it is possible to achieve processing of reducing noise including even kTC noise.

Examples of an image sensor having such a configuration include JP 2004-111590A and JP 2009-278241A.

SUMMARY

However, in technologies in JP 2004-111590A and JP 2009-278241A, there is a need to improve the following.

For example, a signal charge overflows (flows backward) from the memory part holding a signal into the PD currently subjected to the exposure for the next frame, so that intense noise similar to an after-image is generated.

Here, the after-image refers to the following phenomenon. When a signal charge is transferred from the PD to the FD in an image sensor in related art, an signal charge is not completely transferred and stays in the PD, and the charge remaining after the transfer is added to the next frame. For this reason, shooting a moving subject results in such an image that trails away.

Experiments show that the after-image caused by the charge overflow has a correlation with a difference between a PD-MEM barrier electric-potential and a MEM electric-potential (in accumulation state).

The charge overflows and moves from the memory part to the PD, because the charge obtains certain energy because of heat and jumps over the electric-potential difference at a certain probability. For this reason, the smaller the electric-potential difference (i.e., the difference between the PD-MEM barrier electric-potential and the MEM electric-potential (in accumulation state)) is, the more easily the charge can jump over, so that the after-image is also increased. A relationship has been found that the charge overflow approximately logarithmically reduces with respect to the electric-potential difference.

In other words, for reducing the after-image caused by the charge overflow, it is necessary to make larger the difference between the PD-MEM barrier electric-potential and the MEM electric-potential (in accumulation state).

The present technology is disclosed under such circumstances, and it is desirable to reduce occurrence of an after-image caused by charge overflow.

According to an embodiment of the present technology, there is provided a solid-state image sensor including a photoelectric conversion part which generates a charge corresponding to received light and accumulates the charge therein, a charge holding part in which before the charge accumulated in the photoelectric conversion part is transferred to a floating diffusion region, the charge is held for a predetermined time, a first transfer gate which transfers the charge accumulated in the photoelectric conversion part to the charge holding part, a second transfer gate which transfers the charge held in the charge holding part to the floating diffusion region, and a charge discharging gate which discharges the charge in the photoelectric conversion part. Before charge accumulation in the photoelectric conversion part for the next frame is started, part of the charge accumulated in the charge holding part is discharged.

In order to transfer the charge accumulated in the photoelectric conversion part to the charge holding part, a driving voltage may be applied to the charge discharging gate when a driving voltage is applied to the first transfer gate.

The solid-state image sensor may further include a reset transistor which resets the charge accumulated in the floating diffusion region. A driving pulse for the charge discharging gate is raised concurrently with lowering a driving pulse for the reset transistor.

After the charge accumulated in the photoelectric conversion part is transferred to the charge holding part by driving the first transfer gate, a value of a voltage applied to the second transfer gate may be set at an intermediate value between values of a voltage at a time of driving and a voltage at a time of driving stop.

The value of the voltage applied to the second transfer gate at a time of lowering a driving pulse of a driving voltage of the first transfer gate may be the intermediate value between the values of the voltage at the time of driving and the voltage at the time of driving stop.

After the charge accumulated in the photoelectric conversion part is transferred to the charge holding part by driving the first transfer gate, a value of a voltage applied to the first transfer gate may be set at a lower value at a time of driving stop.

The solid-state image sensor may further include an N-type substrate disposed as a layer which is below the photoelectric conversion part and the charge holding part. A voltage may be applied in a manner that an electric-potential of the N-type substrate becomes high when a driving pulse for the first transfer gate is lowered.

According to an embodiment of the present technology, there is provided a driving method for a solid-state image sensor including a photoelectric conversion part which generates a charge corresponding to received light and accumulates the charge therein, a charge holding part in which before the charge accumulated in the photoelectric conversion part is transferred to a floating diffusion region, the charge is held for a predetermined time, a first transfer gate which transfers the charge accumulated in the photoelectric conversion part to the charge holding part, a second transfer gate which transfers the charge held in the charge holding part to the floating diffusion region, and a charge discharging gate which discharges the charge in the photoelectric conversion part. The driving method includes, before charge accumulation in the photoelectric conversion part for the next frame is started, discharging part of the charge accumulated in the charge holding part.

According to a second embodiment of the present technology, there is provided an electronic device including a solid-state image sensor including a photoelectric conversion part which generates a charge corresponding to received light and accumulates the charge therein, a charge holding part in which before the charge accumulated in the photoelectric conversion part is transferred to a floating diffusion region, the charge is held for a predetermined time, a first transfer gate which transfers the charge accumulated in the photoelectric conversion part to the charge holding part, a second transfer gate which transfers the charge held in the charge holding part to the floating diffusion region, and a charge discharging gate which discharges the charge in the photoelectric conversion part. Before charge accumulation in the photoelectric conversion part for the next frame is started, part of the charge accumulated in the charge holding part is discharged.

According to the first and second embodiments, before the charge accumulation in the photoelectric conversion part for the next frame is started, the part of the charge accumulated in the charge holding part is discharged According to the embodiment of the present technology, it is possible to reduce occurrence of an after-image caused by charge overflow.

BRIEF DESCRIPTION OF THE DRAWINGS

FIG. 22 is a timing chart illustrating still another example of waveforms of driving pulses in a CMOS image sensor to which the embodiment of the present technology is applied;

FIG. 29 is a timing chart illustrating still another example of waveforms of driving pulses in a CMOS image sensor to which the embodiment of the present technology is applied;

DETAILED DESCRIPTION OF THE EMBODIMENT

Figure 1:
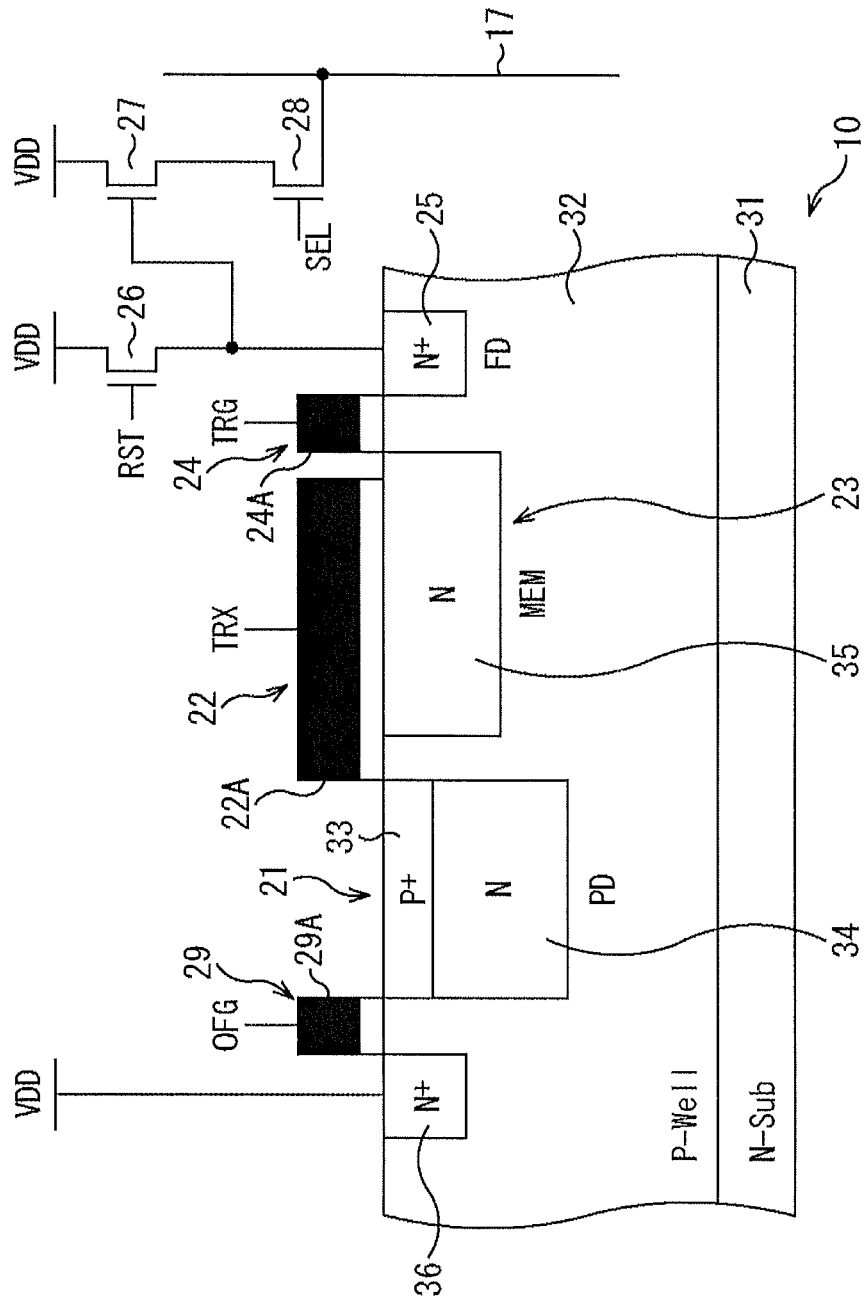
FIG. 1 is a diagram illustrating a configuration example each of unit pixels of a CMOS image sensor including a memory part (MEM) in the pixel.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Firstly, a description is given of global exposure in related art.

A CMOS image sensor, for example, is used as a solid-state imaging device including a solid-state image sensor. The CMOS image sensor reads out, through MOS transistors, a photocharge accumulated in a pn junction capacitor of a photodiode which is a photoelectric transducer. Since the CMOS image sensor executes an operation of reading out the photocharge accumulated in the photodiode in pixel unit, row unit, or the like, it is not possible to provide all of pixels with the same exposure time period during which the photocharge is accumulated. Accordingly, in such a case that a subject is moving, a captured image might have distortion.

Hence, a technology for achieving the global exposure has been developed. In the global exposure, image capturing is performed on all the pixels in the same exposure time period.

In addition, to enable the kTC noise (thermal noise) removal, unit pixels have been developed which, for example, each include a memory part in the pixel besides a floating diffusion.

FIG. 1 is a diagram illustrating a configuration example of each of unit pixels, of a CMOS image sensor, including a memory part (MEM) in the pixel.

Each of unit pixels 10 which is illustrated in the figure includes, as the photoelectric transducer, a photodiode (PD) 21, for example. The PD 21 is a buried photodiode formed, for example, by forming a P-type layer (P+) 33, on the substrate-front-surface side, in a p-type well layer (P-Well) 32 formed on an N-type substrate (N-Sub) 31 and by burying an N-type buried layer (N) 34 in the p-type well layer 32.

The unit pixel 10 includes a first transfer gate (TRX) 22, a memory part (MEM) 23, a second transfer gate (TRG) 24, and a floating diffusion (FD) 25, in addition to the PD 21.

When a transfer pulse TRX is applied to a gate electrode 22A, the TRX 22 transfers a charge photoelectrically converted in the PD 21 and accumulated therein. The MEM 23 is formed by an N-type buried channel 35 (N+) formed below the gate electrode 22A, and holds the charge transferred by the TRX 22 from the PD 21.

The gate electrode 22A is arranged in an upper portion of the MEM 23, and it is possible to perform modulation on the MEM 23 by applying a transfer pulse TRX to the gate electrode 22A. In other words, applying the transfer pulse TRX to the gate electrode 22A leads to a deep potential of the MEM 23. This leads to a larger saturation amount of the charge in the MEM 23 than that in the case without modulation.

When a transfer pulse TRG is applied to a gate electrode 24A, the TRG 24 transfers the charge held in the MEM 23 to the FD 25. The FD 25 is a charge voltage transducer formed by an N-type layer (N+) and converts, into a voltage, the charge transferred by the TRG 24 from the MEM 23.

The unit pixel 10 further includes a reset transistor (RST) 26, an amplification transistor 27, and a select transistor (SEL) 28.

The reset transistor 26 is connected between a power supply VDD and the FD 25, and resets the FD 25 when a reset pulse RST is applied to a gate electrode of the reset transistor 26. The amplification transistor 27 has a drain electrode connected to the power supply VDD, and a gate electrode connected to the FD 25, so that a voltage of the FD 25 is read out.

For example, a drain electrode of the select transistor 28 is connected to a source electrode of the amplification transistor 27, and a source electrode thereof is connected to a corresponding one of vertical signal lines 17. When a selection pulse SEL is applied to a gate electrode of the select transistor 28, the select transistor 28 thereby selects one of the unit pixels 10 from which a signal should be read out.

Note that the reset transistor 26, the amplification transistor 27, and the select transistor 28 may be omitted or shared by a plurality of pixels, depending on the method of reading out a pixel signal.

The unit pixels 10 further includes a charge discharging gate (OFG) 29 for discharging the charge accumulated in the PD 21. When a control pulse OFG is applied to a gate electrode 29A at the start of the exposure, the OFG 29 discharges the charge in the PD 21 to a drain part 36 (N+) which is a N-type layer.

FIG. 2 is a diagram illustrating potentials of parts of the unit pixel 10 in a global exposure operation.

FIG. 2 illustrates the gate electrodes of the respective OFG, the TRX, and the TRG by using horizontally long rectangles on the upper side of each partial figure. Black ones of these rectangles in the figure each show the gate electrode to which a driving voltage (pulse) is applied. FIG. 2 schematically illustrates the degree of a potential between the PD and the MEM on the lower side of the corresponding partial figure. In each partial figure of FIG. 2, a higher electric-potential is shown on the lower side of the figure, and a lower electric-potential is shown on the upper side. Accordingly, the lower the electric-potential is, the higher a barrier is. The higher the electric-potential is, the lower the barrier is.

Figure 2A:
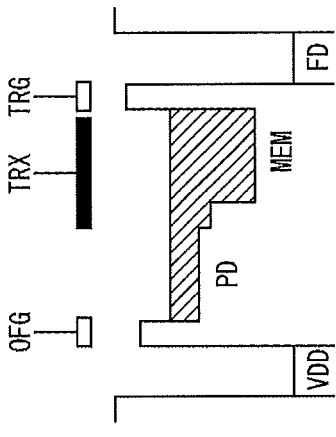
FIGS. 2A, 2B, 2C, 2D, and 2E are diagrams illustrating potentials of parts in the unit pixel in FIG. 1 in a global exposure operation.

In executing the global exposure operation, the OFG is turned ON (driven) as illustrated in FIG. 2A to discharge the charge in the PD, so that the PD can firstly be reset simultaneously in each pixel. In FIG. 2A, when the driving voltage is applied to the OFG to turn ON the OFG, the barrier below the OFG thereby becomes low (the electric-potential becomes high), so that the charge in the PD is discharged to the power supply VDD side.

Figure 2B:
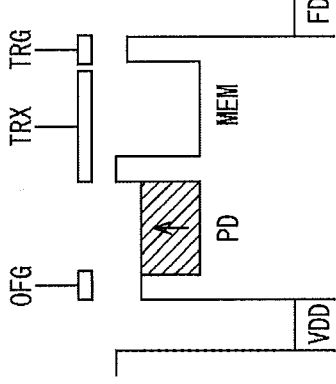

Thereafter, as illustrated in FIG. 2B, the driving voltage (pulse) of the OFG is lowered to turn OFF the OFG, so that the simultaneous exposure is started. Thereby, the charge generated due to the photoelectric conversion in the PD is accumulated in the PD. In FIG. 2B, when the OFG is turned OFF, the barrier below the OFG becomes high to check the discharging of the charge in the PD, so that the charge is accumulated in the PD. Note that the accumulated charge is represented by oblique lines in the figure.

Figure 2C:
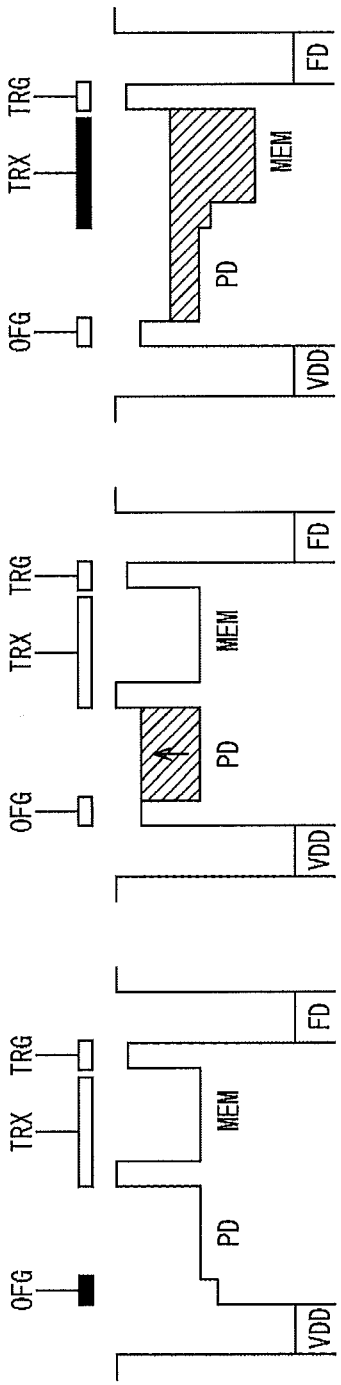

Upon completion of the exposure, the driving voltage is applied to the TRX simultaneously in each pixel to turn ON the TRX, as illustrated in FIG. 2C, and the charge accumulated in the PD is transferred to the MEM. In FIG. 2C, turning ON the TRX causes the barrier between the PD and the MEM below the TRX to be lower and the potential of the MEM to be deeper. Thereby, the charge accumulated in the PD is transferred to the MEM.

Figure 2D:
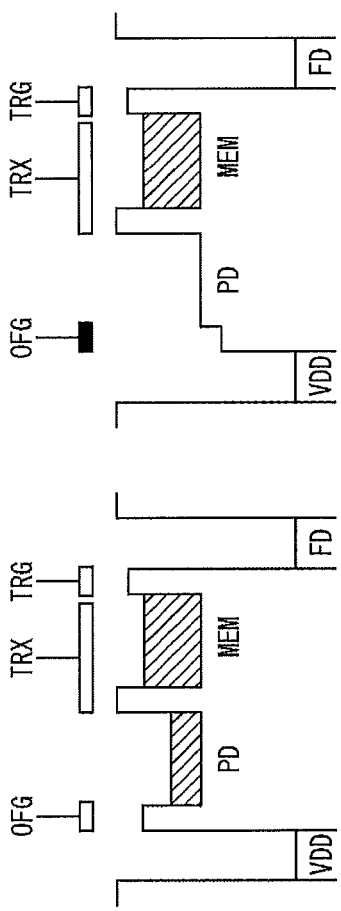

Thereafter, as illustrated in FIG. 2D, the driving voltage (pulse) of the TRX is lowered to turn OFF the TRX, and the charge transferred from the PD is held in the MEM. In FIG. 2D, turning OFF the TRX causes the barrier between the PD and the MEM to be high, and the charge is accumulated and held in the MEM. Note that at this time, a charge which is not completely transferred to the MEM stays in the PD.

Figure 2E:

Then, as illustrated in FIG. 2E, the OFG is turned ON (driven) to discharge the charge in the PD. This prevents the charge in the PD from overflowing therefrom to flow into the MEM holding the charge (blooming) and causes resetting of the PD for the next frame.

Subsequently, sequential readout is performed of a reset level and a signal level. In other words, the FD is reset to read out the reset level, the charge held in the MEM is transferred to the FD, and thereafter the signal level is read out. Then, CDS (Correlated Double Sampling) processing of subtracting reset noise from the signal level is performed, enabling processing of removing noise including the kTC noise.

Figure 3:
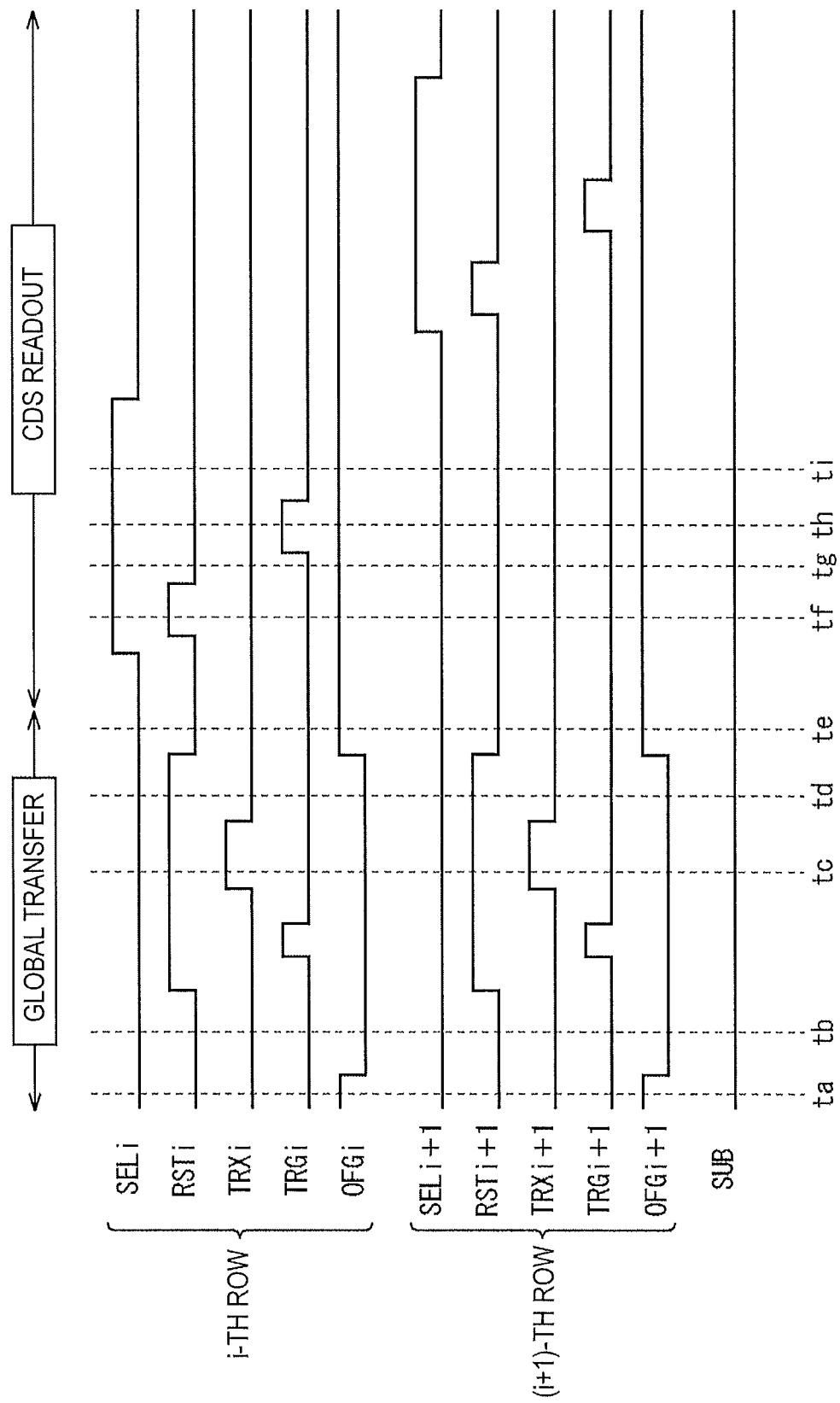
FIG. 3 is a timing chart illustrating waveforms of driving pulses in the global exposure operation.

FIG. 3 is a timing chart illustrating waveforms of the driving pulses in the global exposure operation. The figure has the horizontal axis representing time and illustrates waveforms of the driving pulse SEL to be applied to the select transistor 28; the driving pulse RST, to the reset transistor 26; the driving pulse TRX, to the gate electrode 22A; the driving pulse TRG, to the gate electrode 24A; the driving pulse OFG, to the gate electrode 29A; and a pulse SUB, to the N-Sub 31. All of the parts are illustrated in FIG. 1.

Here, FIG. 3 illustrates the waveforms of the driving pulses to be applied to unit pixels in the i-th row and the (i+1)-th row among a plurality of unit pixels arranged in a matrix form. To identify each driving pulse in the rows, "i" or "i+1" is suffixed to an identification name of the pulse.

In FIG. 3, the driving pulses are inputted simultaneously to all the unit pixels in a time zone annotated by "global transfer", regardless of the row of the unit pixels. In contrast, in a time zone annotated by "CDS readout" in FIG. 3, the driving pulses are inputted to the unit pixels at different timing depending on the row.

Potentials of the parts at time to in FIG. 3 are illustrated in FIG. 2A. In addition, the potentials of the parts at time tb in FIG. 3 are illustrated in FIG. 2B. Likewise, the potentials of the parts at times tc, td, and to in FIG. 3 are illustrated in FIGS. 2C, 2D, and 2E.

In addition, the FD of each unit pixel in the i-th row is reset at timing shown by time tf in FIG. 3, and a reset level is read out at timing shown by time tg. Moreover, the charge held in the MEM of the pixel in the i-th row is transferred to the FD at timing shown by time th in FIG. 3, and a signal level is read out at timing shown by time ti. Thereby, the CDS processing is performed.

Meanwhile, in the global exposure operation in the related art, there is a need to improve the following.

For example, a signal charge overflows (flows backward) from the MEM holding a signal into the PD currently subjected to the exposure for the next frame, so that intense noise similar to an after-image is generated.

Here, the after-image refers to the following phenomenon. For example, when a signal charge is transferred from the PD to the FD, a signal charge is not completely transferred and stays in the PD, and the charge remaining after the transfer is added to the next frame. For this reason, shooting a moving subject results in such an image that trails away.

Experiments show that the after-image caused by the charge overflow has a correlation with a difference between a PD-MEM barrier electric-potential and a MEM electric-potential (in accumulation state).

Figure 4:
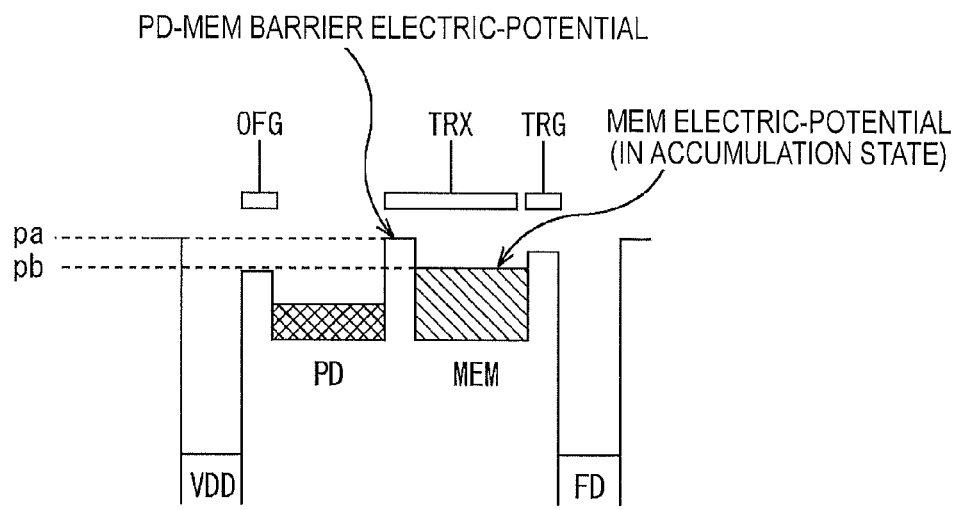
FIG. 4 is a diagram illustrating a difference between a PD-MEM barrier electric-potential and a MEM electric-potential (in accumulation state)

In other words, between time to and time tf in FIG. 3, a charge is accumulated in the PD in a state where the charge is held in the MEM as illustrated in FIG. 4, for example. Here, suppose a difference between a high electric-potential pa (PD-MEM barrier electric-potential) and an electric-potential pb (MEM electric-potential (in accumulation state)) of a water surface of the charge held in the MEM, the electric-potential pa (PD-MEM barrier electric-potential) being between the PD and the MEM illustrated in FIG. 4. When the difference is small, a phenomenon is likely to occur in which the signal charge overflows from the MEM holding a signal into the PD currently subjected to the exposure for the next frame. Note that the charge accumulated in the MEM in FIG. 4 is herein likened to liquid, and the expression of the water surface of the charge held in the MEM is used for the electric-potential pb.

The charge overflows and moves from the memory part to the PD, because the charge obtains certain energy because of heat and jumps over the electric-potential difference at a certain probability. For this reason, the smaller the electric-potential difference (i.e., the difference between the PD-MEM barrier electric-potential and the MEM electric-potential (in accumulation state)) is, the more easily the charge can jump over, so that the after-image is also increased. A relationship has been found that the charge overflow approximately logarithmically reduces with respect to the electric-potential difference.

Figure 5:
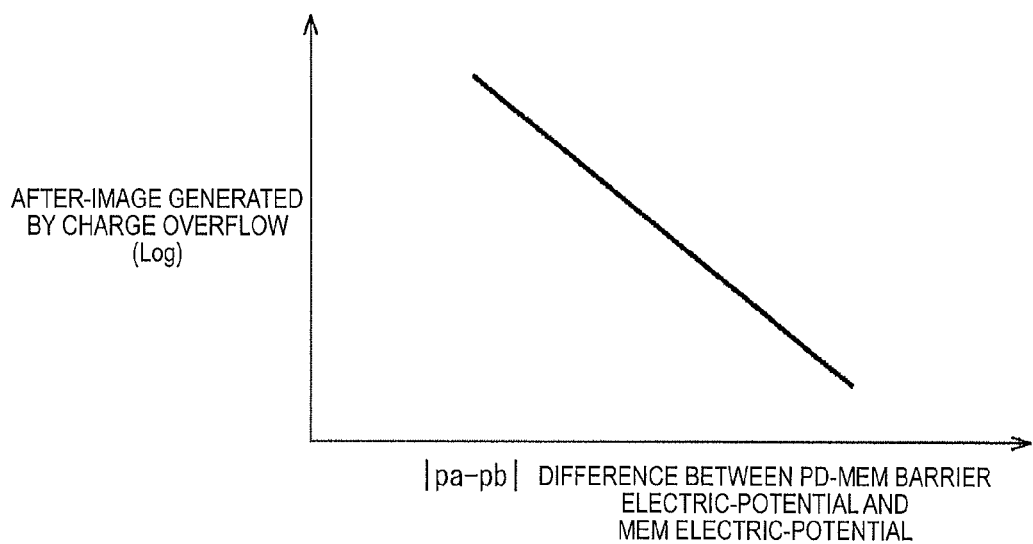
FIG. 5 is a graph illustrating a relationship between an after-image generated by charge overflow and the difference between the PD-MEM barrier electric-potential and the MEM electric-potential (in accumulation state)

FIG. 5 is a graph illustrating the relationship between the after-image caused by the charge overflow and the difference between the PD-MEM barrier electric-potential and the MEM electric-potential (in accumulation state). Note that in the figure, the after-image caused by the charge overflow on the vertical axis is represented by an amount of an overflowing charge (an amount of the after-image) by using a logarithm (log), while the difference between the PD-MEM barrier electric-potential and the MEM electric-potential (in accumulation state) on the horizontal axis is represented by an absolute value of a difference between the electric-potential pa and the electric-potential pb in FIG. 4.

The graph in FIG. 5 exhibits inclination from an upper left part to a lower right part of the figure, and shows that as the difference between the PD-MEM barrier electric-potential and the MEM electric-potential (in accumulation state) becomes larger, an amount of an after-image becomes smaller.

In other words, for reducing the after-image caused by the charge overflow, it is necessary to make larger the difference between the PD-MEM barrier electric-potential and the MEM electric-potential (in accumulation state). For example, if the electric-potential of the water surface of the charge held in the MEM can be made lower, the difference between the PD-MEM barrier electric-potential and the MEM electric-potential (in accumulation state) can be made larger.

Here, a description is given in more detail of how the state of the potential of each part of the unit pixel 10 is changed from that in FIG. 2C to that in FIG. 2D.

In the state in FIG. 2C, a positive bias driving voltage is applied to the gate electrode 22A of the TRX 22 (FIG. 1). Thereby, modulation is performed on the PD-MEM barrier electric-potential and the MEM electric-potential (in depletion state). Then, in the state in FIG. 2C, the voltage of the driving voltage applied to the gate electrode 22A of the TRX 22 is lowered to a predetermined negative bias, so that the TRX 22 is turned OFF.

As the applied voltage is increased from the state where the predetermined negative bias is applied to the gate electrode 22A of the TRX 22 to turn OFF the TRX 22, the potentials become deeper in the PD-MEM barrier electric-potential and the MEM electric-potential (in depletion state), respectively, in accordance with the applied voltage.

However, the PD-MEM barrier electric-potential and the MEM electric-potential (in depletion state) have different degrees of change. This is because a P-type impurity formed in a surface of the MEM for reducing a dark current results in the lower degree of modulation of the MEM electric-potential (in depletion state) than that of the PD-MEM barrier electric-potential.

Figure 6:
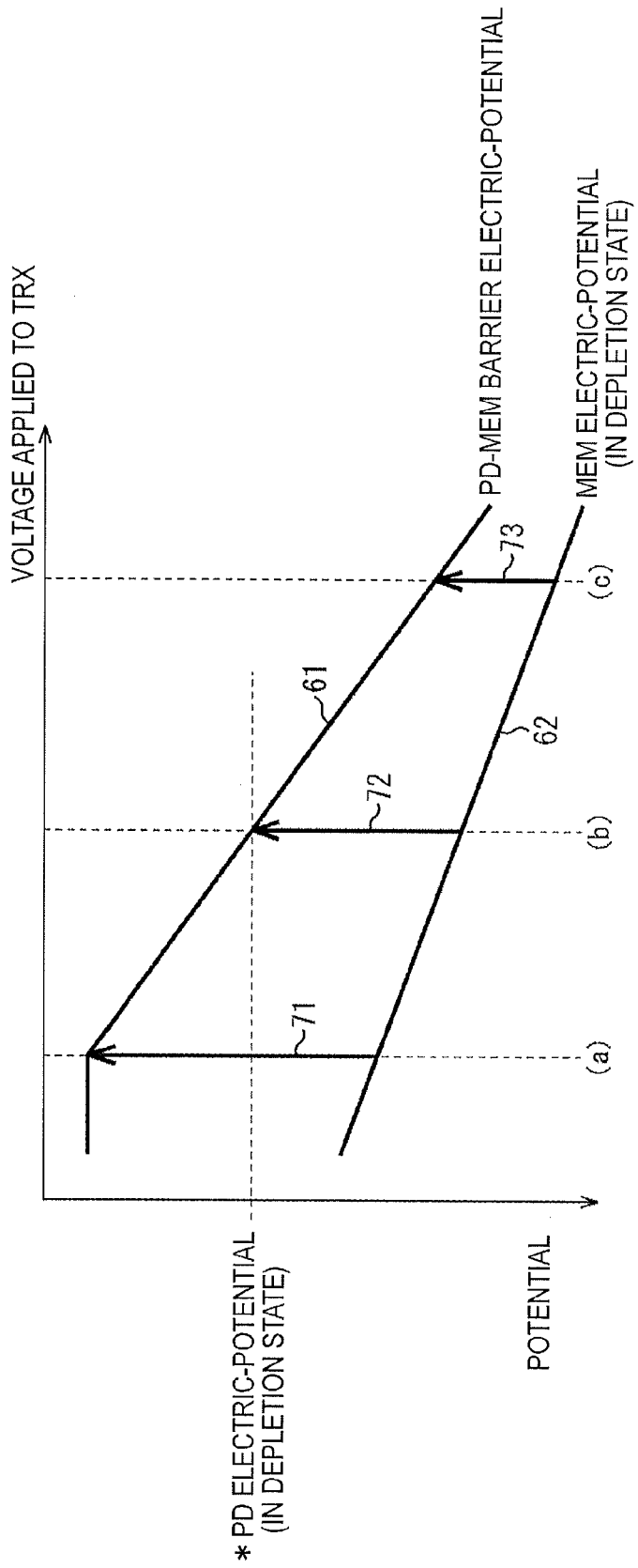
FIG. 6 is a graph illustrating a relationship among a voltage applied to a TRX, the PD-MEM barrier electric-potential, and a MEM electric-potential (in depletion state)

FIG. 6 is a graph illustrating a relationship among a voltage applied to the gate electrode 22A of the TRX 22 (voltage applied to the TRX), the PD-MEM barrier electric-potential, and the MEM electric-potential (in depletion state). In the figure, the voltage applied to the TRX is represented by the horizontal axis, and a positive bias is shown on the right side of the figure. Note that, in an ordinary driving pulse inputted to each unit pixel of the CMOS image sensor, applied voltages for respective ON and OFF are approximately +3V and −1V.

Meanwhile, the vertical axis represents a potential (the degree of lowness of an electric-potential). A line 61 represents the change of the PD-MEM barrier electric-potential in accordance with the change of the voltage applied to the TRX, while a line 62 represents change of the MEM electric-potential (in depletion state) in accordance with the change of the voltage applied to the TRX.

As illustrated in FIG. 6, the lines 61 and 62 incline from an upper left part of the figure to a lower right part, but the line 61 inclines more largely than the line 62. In addition, the line 61 shows that when the voltage applied to the TRX becomes lower than a predetermined value (a voltage indicated by (a) in the figure), the potential becomes constant regardless of the value of the voltage applied to the TRX.

In addition, an arrow 71, an arrow 72, and an arrow 73 in FIG. 6 respectively represent differences each between the PD-MEM barrier electric-potential and the MEM electric-potential (in depletion state) when values of the voltage applied to the TRX in FIG. 6 are (a), (b), and (c), respectively.

FIG. 7 is a diagram illustrating the potentials of the parts in the unit pixel 10 at the time when the values of the voltage applied to the TRX in FIG. 6 are respectively (a), (b), and (c).

Figure 7A:
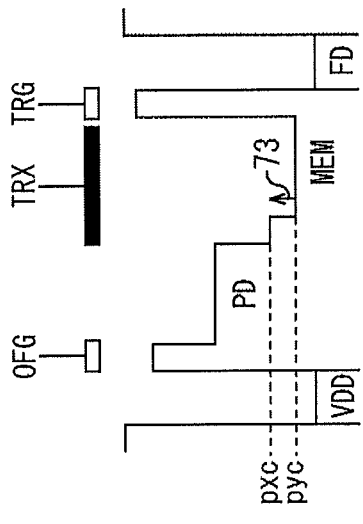
FIGS. 7A, 7B, and 7C are diagrams illustrating the potentials of the parts according to values of the voltage applied to the TRX in FIG. 6.

FIG. 7A illustrates the potentials of the parts of the unit pixel 10 at the time when the value of the voltage applied to the TRX in FIG. 6 is (a). When the value of the voltage applied to the TRX in FIG. 6 is (a), only a short time has passed since the application of the driving voltage is started in the state where the TRX 22 is turned OFF. In other words, the voltage applied to the TRX is still in a low state. At this time, the PD-MEM barrier electric-potential is an electric-potential pxa, while the MEM electric-potential (in depletion state) is an electric-potential pya. The arrow 71 indicates a difference between the PD-MEM barrier electric-potential and the MEM electric-potential (in depletion state) at this time.

Figure 7B:
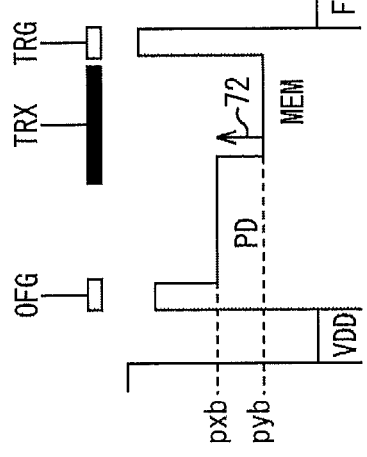

FIG. 7B illustrates the potentials of the parts of the unit pixel 10 at the time when the value of the voltage applied to the TRX in FIG. 6 is (b). When the value of the voltage applied to the TRX in FIG. 6 is (b), the driving voltage is further applied. In other words, the voltage applied to the TRX is in a slightly high state. At this time, the PD-MEM barrier electric-potential is an electric-potential pxb, while the MEM electric-potential (in depletion state) is an electric-potential pyb. The arrow 72 indicates a difference between the PD-MEM barrier electric-potential and the MEM electric-potential (in depletion state) at this time.

Figure 7C:
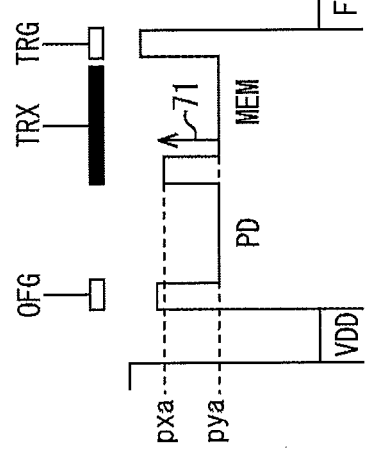

FIG. 7C illustrates the potentials of the parts of the unit pixel 10 at the time when the value of the voltage applied to the TRX in FIG. 6 is (c). When the value of the voltage applied to the TRX in FIG. 6 is (c), the driving voltage is fully applied. In other words, the voltage applied to the TRX is in a considerably high state. At this time, the PD-MEM barrier electric-potential is an electric-potential pxc, while the MEM electric-potential (in depletion state) is an electric-potential pyc. The arrow 73 illustrates a difference between the PD-MEM barrier electric-potential and the MEM electric-potential (in depletion state) at this time.

As learned from FIGS. 6 and 7, the PD-MEM barrier electric-potential and the MEM electric-potential (in depletion state) have the different degrees of change. Accordingly, the higher the voltage applied to the TRX is, the smaller the difference between the PD-MEM barrier electric-potential and the MEM electric-potential (in depletion state) is. Since the difference between the PD-MEM barrier electric-potential and the MEM electric-potential (in depletion state) becomes smaller as the voltage applied to the TRX becomes higher in this way, the charge held in the MEM is contaminated with a non-linear component.

FIG. 8 is a diagram illustrating movement of the charge from the PD to the MEM in the unit pixel 10 at the time when a state changes from that in FIG. 2C to that in FIG. 2D. Note that the charges accumulated in the PD and held in the MEM are represented by oblique lines in the figure.

Figure 8A:
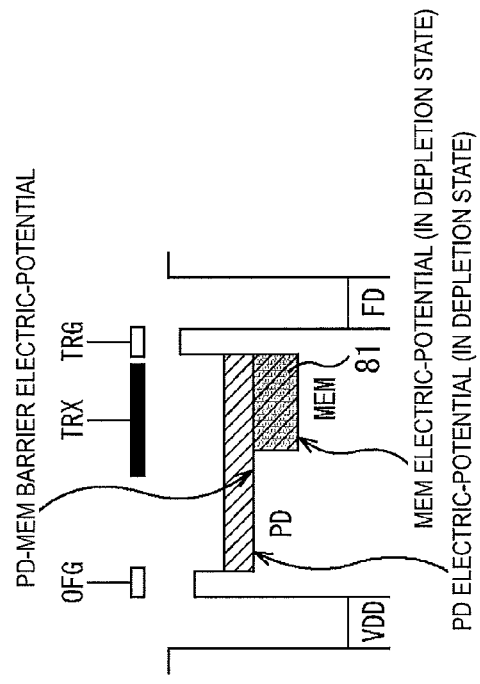
FIGS. 8A, 8B, 8C, and 8D are diagrams each illustrating movement of a charge at the time when a state is changed from that in FIG. 2C to that in FIG. 2D.

FIG. 8A is a diagram illustrating movement of the charge in the state which is the same as in FIG. 2C and in which the voltage applied to the TRX is fully high. As illustrated in the figure, since the potential between the PD and the MEM is fully low, the charge accumulated in the PD moves to the MEM.

Figure 8B:
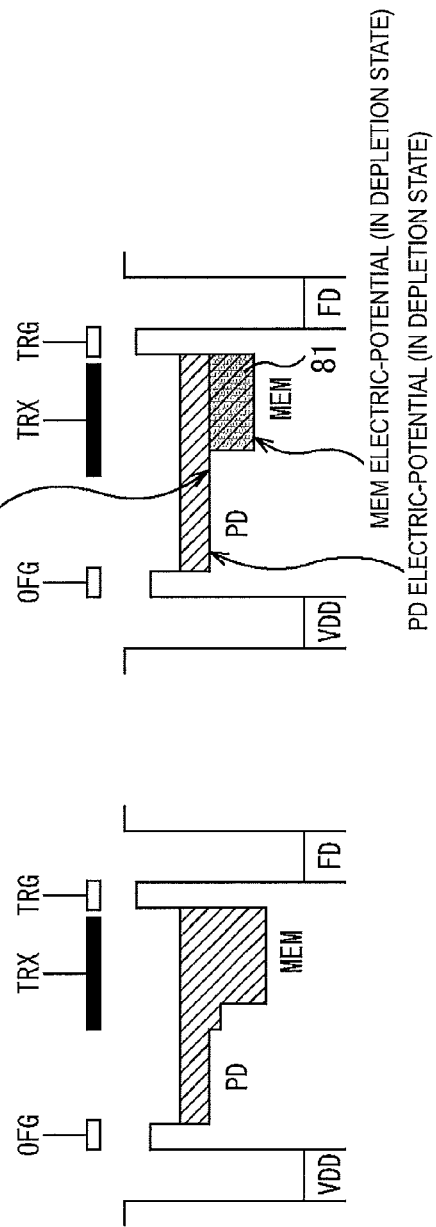

In FIG. 8B, the potential between the PD and the MEM becomes slightly higher and is approximately equal to a PD electric-potential (in depletion state), because the voltage applied to the TRX is lower than in the state in FIG. 8A. The potentials of the parts of the unit pixel 10 in FIG. 8B are the same as the potentials of the parts in FIG. 7B.

A charge amount corresponding to a capacity of a region 81 in FIG. 8B is equivalent to the minimum value of a charge amount allowed to be held in the MEM. Accordingly, as long as an amount of the charge accumulated in the PD does not exceed the charge amount corresponding to the capacity of the region 81, the amount of the charge held in the MEM linearly increases with the increase of the amount of the charge accumulated in the PD. Note that the charge amount corresponding to the capacity of the region 81 is a charge amount to be determined according to the depth of the potential shown by the arrow 72 in FIG. 7.

However, when the amount of the charge accumulated in the PD exceeds the charge amount corresponding to the capacity of the region 81 as in the case in FIG. 8B, the amount of the charge held in the MEM is finally larger than the charge amount corresponding to the capacity of the region 81.

Figure 8C:
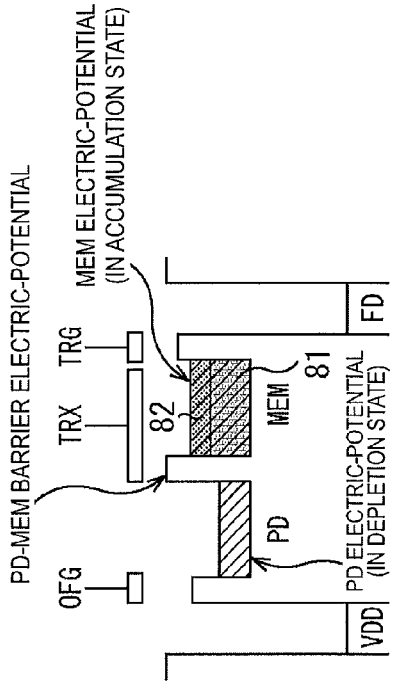

In FIG. 8C, the PD-MEM barrier is high, because the voltage applied to the TRX is further lower than in the state in FIG. 8B. At this time, the amount of the charge held in the MEM corresponds to the capacities of the region 81 and a region 82.

Figure 8D:
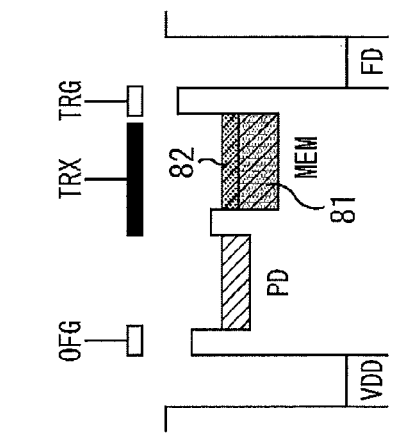

In FIG. 8D, the PD-MEM barrier is further higher, because the voltage applied to the TRX is further lower than in the state in FIG. 8B. The potentials of the parts of the unit pixel 10 in FIG. 8D are the same as the potentials of the parts in FIG. 7A. At this time, the amount of the charge held in the MEM also corresponds to the capacities of the regions 81 and 82.

A charge amount corresponding to a capacity of the region 82 does not linearly increase with the increase of the amount of the charge accumulated in the PD, unlike the charge amount corresponding to the capacity of the region 81. In this case, the charge amount corresponding to the capacity of the region 82 is held in the MEM, for example, in accordance with the height of the PD-MEM barrier in the state in FIG. 8C. In addition, since the depth of the potential of the MEM is limited, the charge amount corresponding to the capacity of the region 82 hardly increases even if the amount of the charge accumulated in the PD further increases.

As described above with reference to FIG. 8, the charge held in the MEM is contaminated with the non-linear component corresponding to the region 82.

Figure 9:
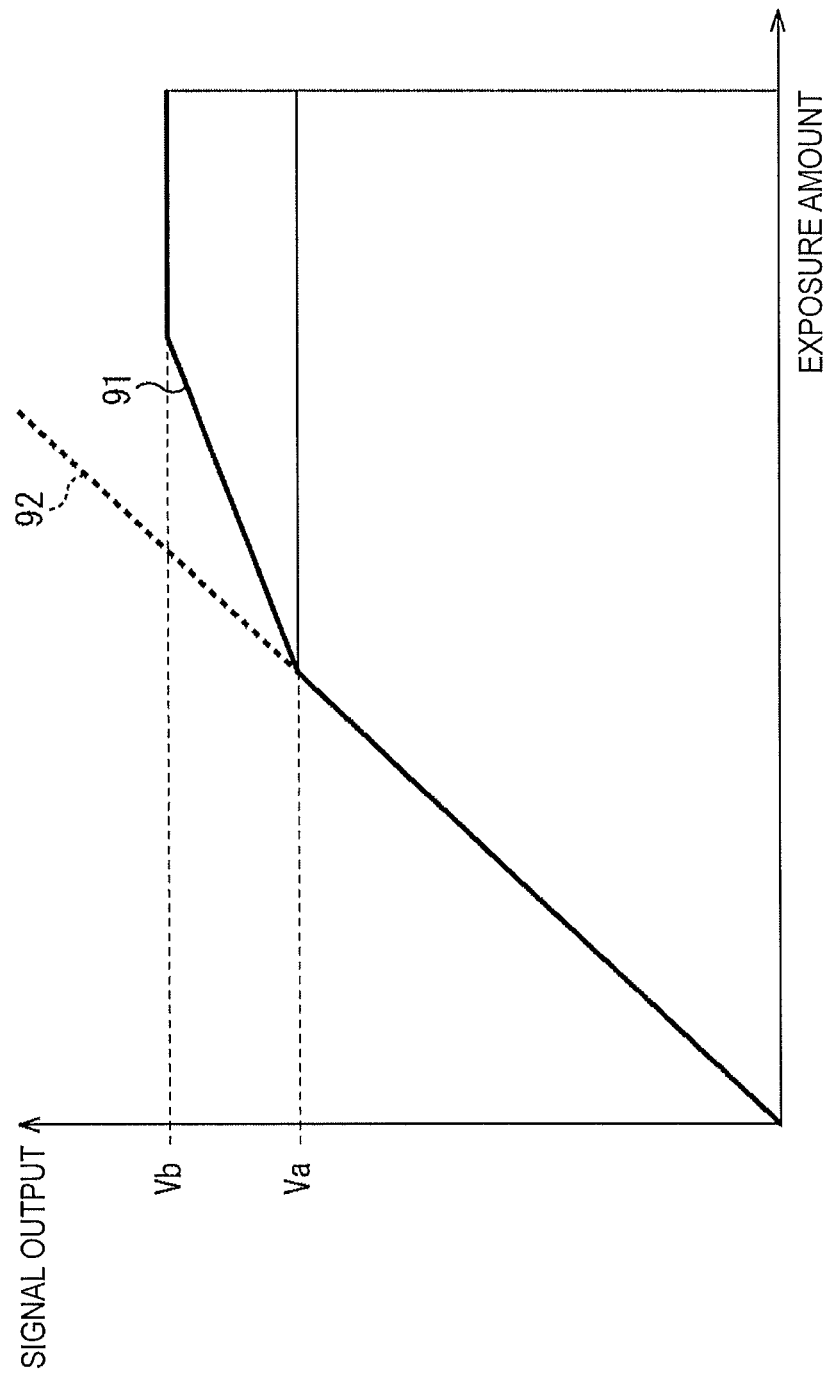
FIG. 9 is a diagram illustrating a relationship between an exposure amount and signal output from a unit pixel.

FIG. 9 is a diagram illustrating a relationship between an exposure amount and signal output from the unit pixel 10. In the figure, the horizontal axis represents an exposure amount, while the vertical axis represents signal output. In addition, a solid line 91 represents signal output change in accordance with the change of the exposure amount. Note that a value of an outputted signal corresponding to a voltage value of the FD to which the charge held in the MEM is transferred is used for the signal output. Accordingly, the larger an amount of the charge held in the MEM is, the larger the signal output is.

As illustrated in FIG. 9, the solid line 91 linearly extends upward with the increase of the exposure amount, until a time point when the signal output reaches Va. However, when the signal output exceeds Va, the solid line 91 inclines gently. Further, when the signal output exceeds Vb, the solid line 91 extends almost horizontally.

In other words, when exceeding Va, the signal output does not linearly increase with the increase of the exposure amount. Note that in FIG. 9, a dotted line 92, for reference, represents the change of the signal output linearly increasing with the increase of the exposure amount.

In other words, when the amount of the charge held in the MEM is the charge amount corresponding to the capacity of the region 81 in FIG. 8, the signal output is Va. When the amount of the charge held in the MEM is the charge amount corresponding to the capacities of the regions 81 and 82 in FIG. 8, the signal output is Vb.

As described above, when the global exposure operation in the related art is executed, the charge held in the MEM includes the non-linear component. This results in a smaller difference between the PD-MEM barrier electric-potential and the MEM electric-potential (in accumulation state), and an after-image might be generated due to charge overflow.

For example, if the degree of modulation is enhanced by reducing the density of the P-type impurity in the MEM surface, it is possible to make the degrees of the change of the PD-MEM barrier electric-potential and the MEM electric-potential (in depletion state) equal to each other and prevent the charge held in the MEM from being contaminated with the non-linear component. However, this deteriorates pinning of the MEM surface. For this reason, it is necessary to compensate for the MEM surface pinning weakness by enhancing a negative bias to a transfer gate, so that a surface electric field becomes intense. This results in deterioration due to a leakage component attributable to the intense electric field and deteriorates reliability of a withstand voltage of a gate oxide film.

If the degree of modulation of the PD-MEM barrier electric-potential is lowered in accordance with the MEM electric-potential (in depletion state), it is also possible to make the degrees of change of the PD-MEM barrier electric-potential and the MEM electric-potential (in depletion state) equal to each other. However, this is difficult to employ, because the lowering of the degree of modulation of the PD-MEM barrier electric-potential influences the charge transfer from the PD to the memory part.

Hence, an embodiment of the present technology makes it possible to remove the non-linear component of the charge held in the MEM to check occurrence of the after-image caused by the charge overflow.

Figure 10:
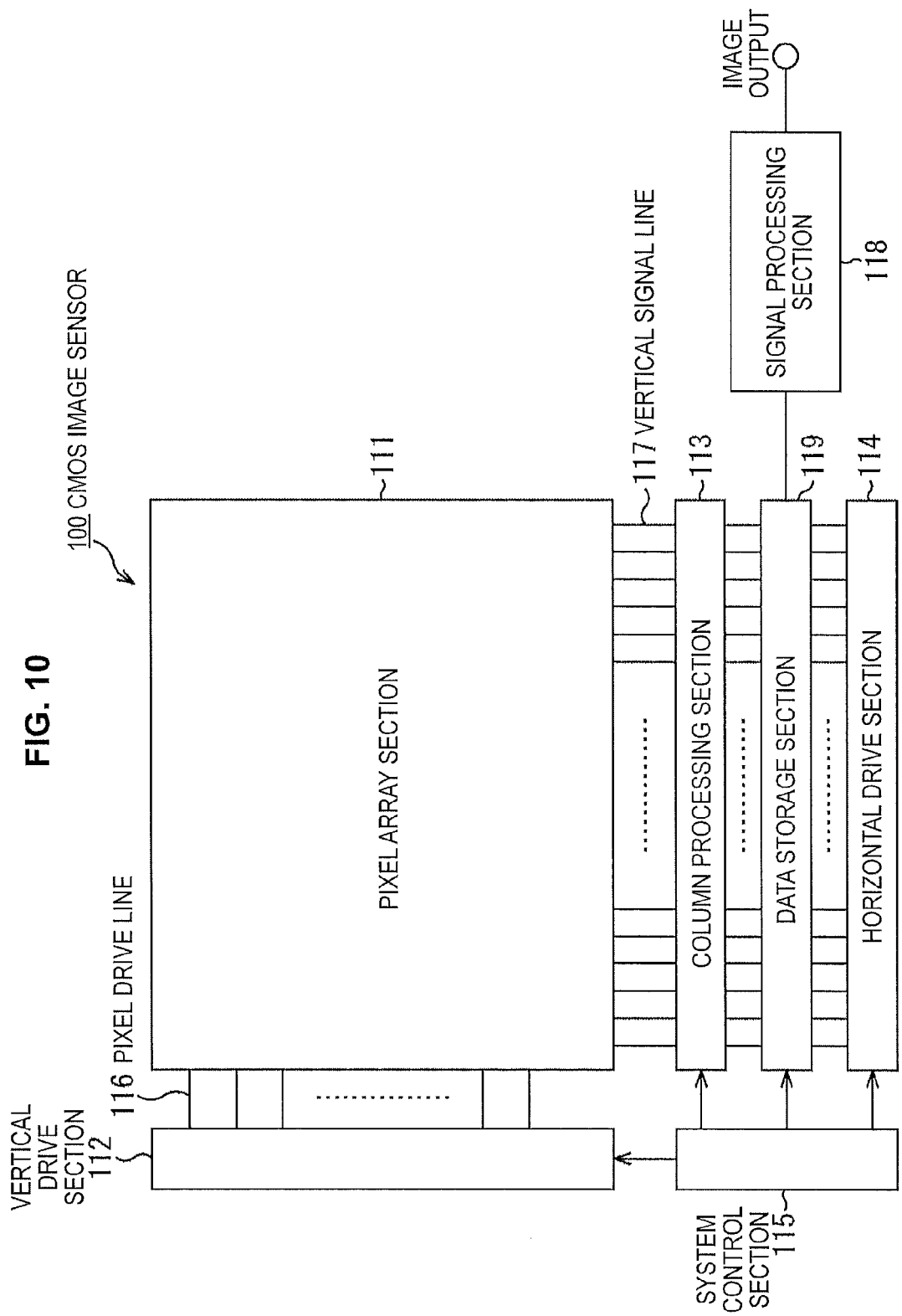
FIG. 10 is a system configuration diagram illustrating an outline of a solid-state imaging device to which an embodiment of the present technology is applied.

FIG. 10 is a system configuration diagram illustrating an outline of a solid-state imaging device to which the embodiment of the present technology is applied. FIG. 10 illustrates the system configuration diagram illustrating the outline of a CMOS image sensor 100 to which the embodiment of the present technology is applied.

As illustrated in FIG. 10, the CMOS image sensor 100 according to the present embodiment has a configuration including a pixel array section 111 which is formed on a not-shown semiconductor substrate (chip), and peripheral circuits which are integrated on the same semiconductor substrate on which the relevant pixel array section 111 is formed. In this case, the peripheral circuits include a vertical drive section 112, a column processing section 113, a horizontal drive section 114 and a system control section 115, for example.

The CMOS image sensor 100 further includes a signal processing section 118 and a data storage section 119. The signal processing section 118 and the data storage section 119 may be configured of external signal processing sections such, for example, as DSPs (Digital Signal Processors), or the like, or may be mounted on the same substrate on which the image sensor 100 is formed.

In the pixel array section 111, unit pixels (hereinafter, sometimes referred to simply as "pixels") each having a photoelectric transducer generating light charge (hereinafter, sometimes referred to simply as "charge") in a charge amount corresponding to an amount of incident light to accumulate it therein are two-dimensionally arranged in a matrix form. The configuration of the unit pixel will be described later.

In the pixel array section 111, pixel drive lines 116 are formed in the horizontal direction in the figure (arrangement direction of pixels in pixel row) for each row with respect to the pixel arrays arranged in a matrix form, and vertical signal lines 117 are formed in the vertical direction (arrangement direction of pixels in pixel column) in the figure for each column. In FIG. 10, each pixel drive line 116 is indicated as one line, whereas it is not limited to one in reality. One end of the pixel drive line 116 is connected to an output terminal corresponding to each row of the vertical drive section 112.

The vertical drive section 112 is configured of a shift register, an address decoder and the like, and is a pixel drive section driving the individual pixels of the pixel array section 111 simultaneously for all pixels, or in row unit, or the like. This vertical drive section 112, the specific configuration of which is omitted in the figure, typically includes two scanning systems of a readout scanning system and a sweep scanning system.

To read signals from the unit pixels of the pixel array section 111, the readout scanning system performs selective scanning on the unit pixels serially in row unit. The sweep scanning system performs sweep scanning on a read-out row to be subjected to readout scanning by the readout scanning system. The sweep scanning precedes the readout scanning by a time equivalent to a shutter speed.

By sweep scanning due to the sweep scanning system, unrequired charges are swept out of the photoelectric transducers of the unit pixels in the read-out row (are reset). By this sweeping-out (resetting) of the unrequired charges due to the sweep scanning system, so-called electronic shutter operation is performed. Herein, the electronic shutter operation is an operation of discarding the light charges of the photoelectric transducers and newly starting exposure (starting accumulation light charges).

A signal read out by readout operation due to the readout scanning system corresponds to the amount of light having been incident after the immediately preceding readout operation or electronic shutter operation. Then, a time period from readout timing or sweep timing due to the immediately preceding readout operation or electronic shutter operation to readout timing due to the current readout operation is an accumulation time (exposure time) of the photocharge in the unit pixel.

Signals outputted from individual unit pixels in pixel row having undergone selective scanning due to the vertical drive section 112 are supplied to the column processing section 113 through the respective vertical signal lines 117. The column processing section 113 performs predetermined signal processing on the signals outputted from the individual unit pixels in selected row through the vertical signal line 117 for the respective pixel columns of the pixel array section 111, and in addition, temporarily holds the pixel signals after the signal processing.

Specifically, the column processing section 113 performs at least noise removing processing, for example, the CDS (Correlated Double Sampling) processing as the signal processing. By this CDS processing due to the column processing section 113, fixed pattern noises intrinsic to pixels such as reset noise and scattering of thresholds of amplification transistors is removed. The column processing section 113 can be provided not only with the function of the noise removing processing but, for example, with an AD (Analog Digital) conversion function, so as to output signal levels in digital signals.

The horizontal drive section 114 is configured of a shift register, an address decoder and the like, and sequentially selects unit circuits corresponding to individual pixel columns in the column processing section 113. By selective scanning due to this horizontal drive section 114, the pixel signals having undergone the signal processing in the column processing section 113 are sequentially outputted.

The system control section 115 is configured of a timing generator generating various timing signals, and the like, and performs drive controls on the vertical drive section 112, column processing section 113, horizontal drive section 114 and the like based on the various timing signals generated by the relevant timing generator.

The signal processing section 118 has at least an addition processing function, and performs various kinds of signal processing such as the addition processing on the pixel signals outputted from the column processing section 113. The data storage section 119 temporarily stores data used for such processing as the signal processing in the signal processing section 118.

Figure 11:
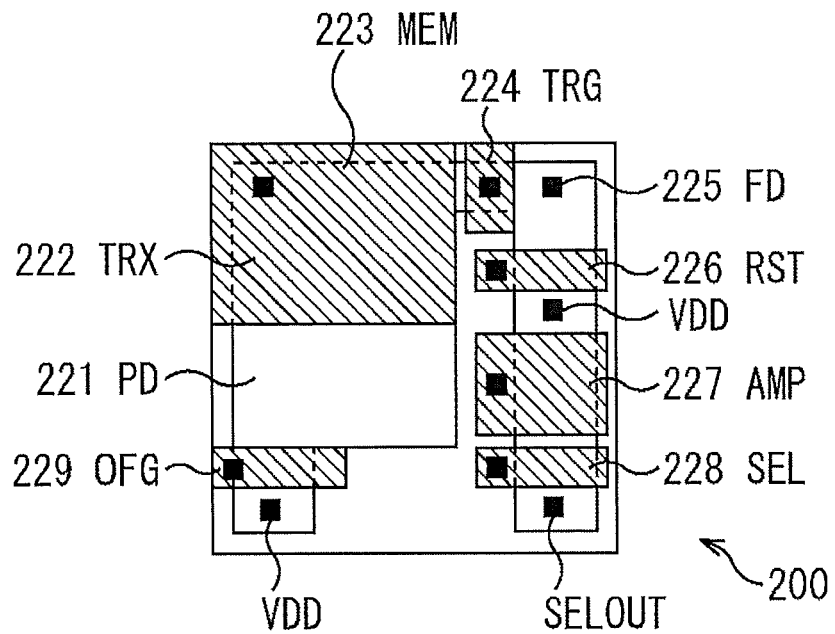
FIG. 11 is a plan diagram illustrating a configuration of each of unit pixels arranged in a pixel array section in FIG. 10.

FIG. 11 is a plan diagram illustrating a configuration of each of unit pixels arranged in the pixel array section 111 in FIG. 10. Each of unit pixels 200 which is illustrated in the figure includes a PD 221, a first transfer gate (TRX) 222, a memory part (MEM) 223, a second transfer gate (TRG) 224, a floating diffusion (FD) 225, and a charge discharging gate (OFG) 229. The unit pixel 200 further includes a reset transistor (RST) 226, an amplification transistor (AMP) 227, and a select transistor (SEL) 228.

Note that in the figure, terminals connected to a power supply VDD and the vertical signal line 117 are respectively denoted with VDD and SELOUT.

Figure 12:
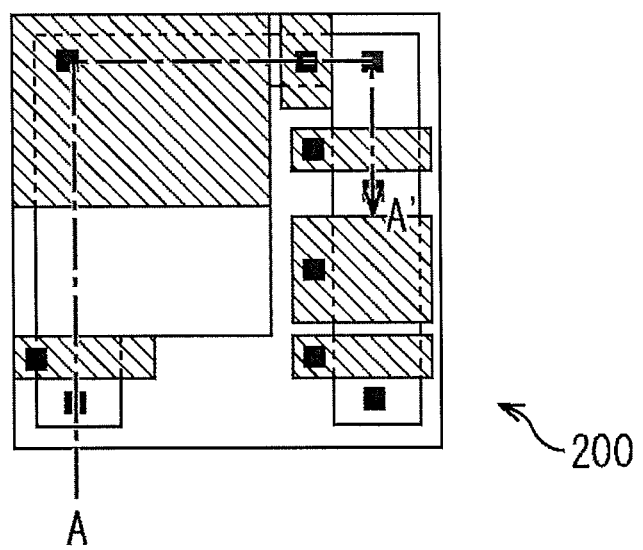
FIG. 12 is a plan diagram similar to FIG. 11.
Figure 13:
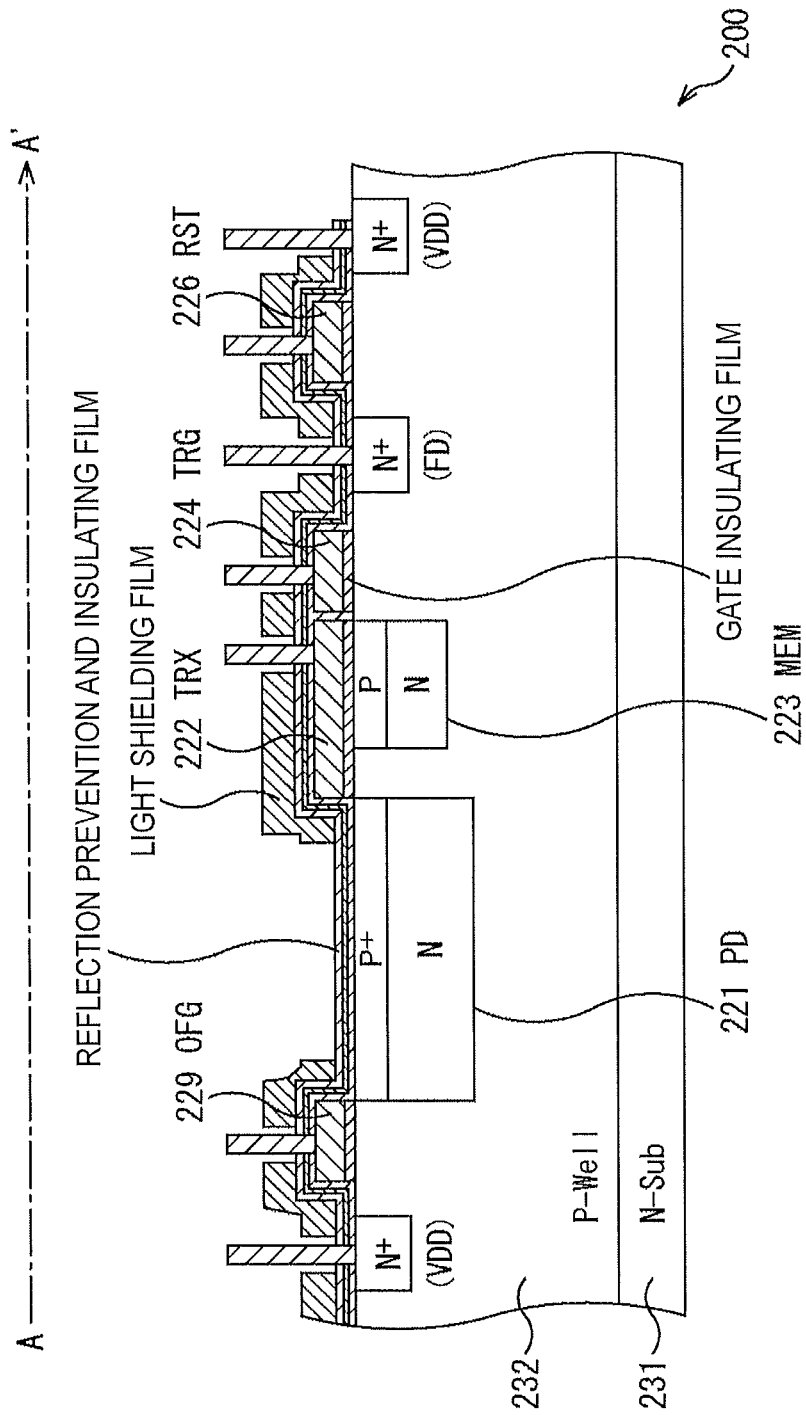
FIG. 13 is a cross-sectional diagram taken along an A-A' dashed line in FIG. 12.

FIG. 12 is a plan diagram similar to FIG. 11, and FIG. 13 is a cross-sectional diagram taken along an A-A' dashed line in FIG. 12.

As illustrated in FIG. 13, a surface of the unit pixel 200 is covered with a light shielding film, except a portion corresponding to the PD 221. A reflection prevention and insulating film is disposed under the light shielding film. Further, a gate insulating film is disposed under gate electrodes of the OFG 229, the TRX 222, the TRG 224, and the RST 226.

The PD 221 is a buried photodiode formed, for example, by forming a P-type layer (P+), on the substrate-front-surface side, in a p-type well layer (P-Well) formed on an N-type substrate (N-Sub) and by burying an N-type buried layer (N) in the p-type well layer.

When a transfer pulse TRX is applied to the gate electrode of the TRX 222, the TRX 222 transfers a charge photoelectrically converted in the PD 221 and accumulated therein.

The MEM 223 is formed by a P-type impurity (P) and an N-type buried channel (N) formed below the gate electrode of the TRX 222, and holds the charge transferred by the TRX 222 from the PD 221.

The gate electrode is arranged in an upper portion of the MEM 223 and it is possible to perform modulation on the MEM 223 by applying the transfer pulse TRX to the gate electrode. In other words, applying the transfer pulse TRX to the gate electrode leads to a deep potential of the MEM 223. This leads to a larger saturation amount of the charge in the MEM 223 than that in the case without modulation.

The TRX 222 is formed in such a manner as to cover the MEM 223. When a positive bias is applied to the TRX 222, modulation due to capacitive coupling causes the potential of the MEM 223 and a PD-MEM barrier to be deeper. The charge is transferred from the PD 221 to the MEM 223, and thereafter the TRX 222 is turned OFF. This results in a state where a signal charge is held in the MEM 223. The charge transferred to the MEM 223 is held therein until sequential readout is performed. At this time, a negative bias is applied to the TRX 222 to perform pinning on the surface of the MEM 223, so that a dark current is prevented.

Note that the P-type impurity is formed in the surface of the MEM 223 illustrated in the figure to facilitate the pinning. Except this point, the unit pixel 200 has the same configuration as in the case of the unit pixel 10 in FIG. 1.

When a transfer pulse TRG is applied to the gate electrode of the TRG 224, the TRG 224 transfers the charge held in the MEM 223 to the FD 225.

The FD 225 is a charge voltage transducer formed by an N-type layer (N+) and converts, into a voltage, the charge transferred by the TRG 224 from the MEM 223.

When a control pulse OFG is applied to the gate electrode of the OFG 229 at the start of exposure, the OFG 229 discharges the charge in the PD 221 to a drain part (N+) which is an N-type layer.

The PD 221 can be depleted (reset) by turning ON the OFG 229. In the global exposure operation, a signal charge obtained by the exposure performed simultaneously in each pixel is transferred to the MEM 223 to thereby achieve accumulation concurrency. Even though the MEM 223 holds a charge, use of the OFG 229 makes it possible to reset the PD 221 at any timing to start the exposure for the next frame.

Without the OFG 229, it is necessary to start the exposure for the next frame in such a manner that the charge held in the MEM 223 of each pixel is read out and that the charge in the PD 221 is then discharged to the FD 225 by driving the TRX 222 and the TRG 224. This leads to waiting until the charge held in the MEM 223 of every pixel is read out, and the frame rate is reduced by an amount corresponding to the waiting time.

The RST 226 is connected between the power supply VDD and the FD 225, and resets the FD 225 when a reset pulse RST is applied to the gate electrode of the RST 226.

The AMP 227 has a drain electrode (not illustrated in the figure) connected to the power supply VDD and a gate electrode connected to the FD 225, so that a voltage of the FD 225 is read out.

The SEL 228 (not illustrated in the figure) has, for example, a drain electrode connected to a source electrode of the AMP 227 and a source electrode connected to the corresponding vertical signal line 117. When a selection pulse SEL is applied to a gate electrode of the SEL 228, the SEL 228 selects one of the unit pixels 200 from which a pixel signal should be read out.

Note that the RST 226, the AMP 227, and the SEL 228 may be omitted or shared by a plurality of pixels, depending on the method of reading out a pixel signal.

Figure 14:
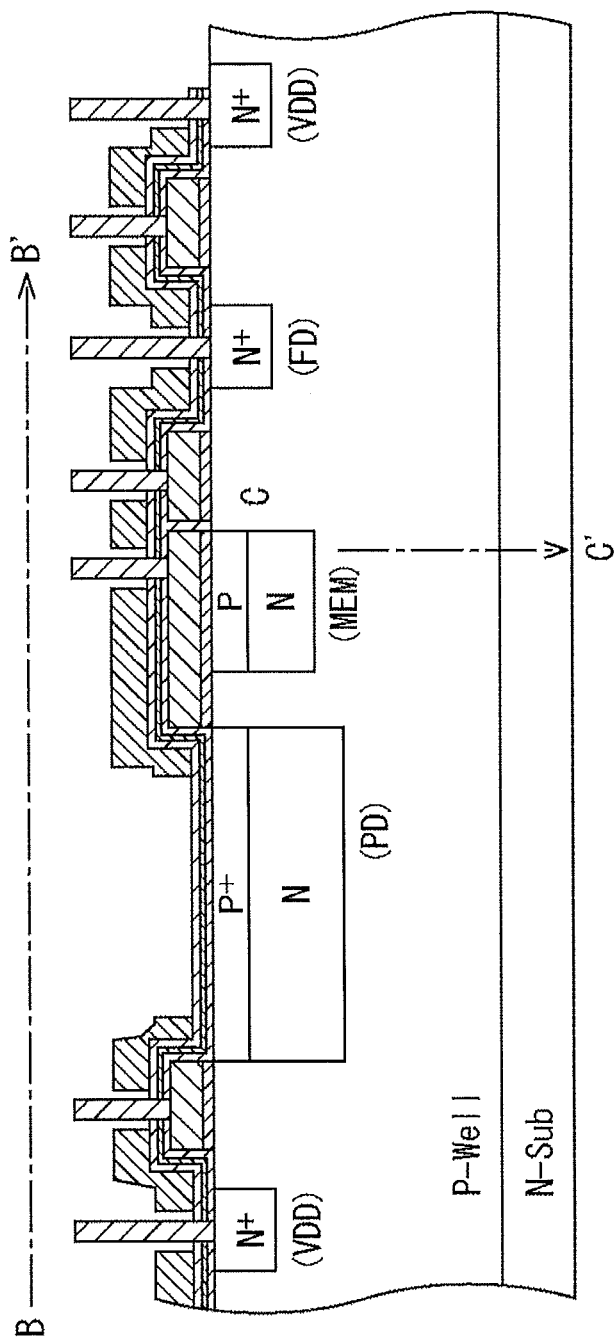
FIG. 14 is a cross-sectional diagram similar to FIG. 13.
Figure 15:
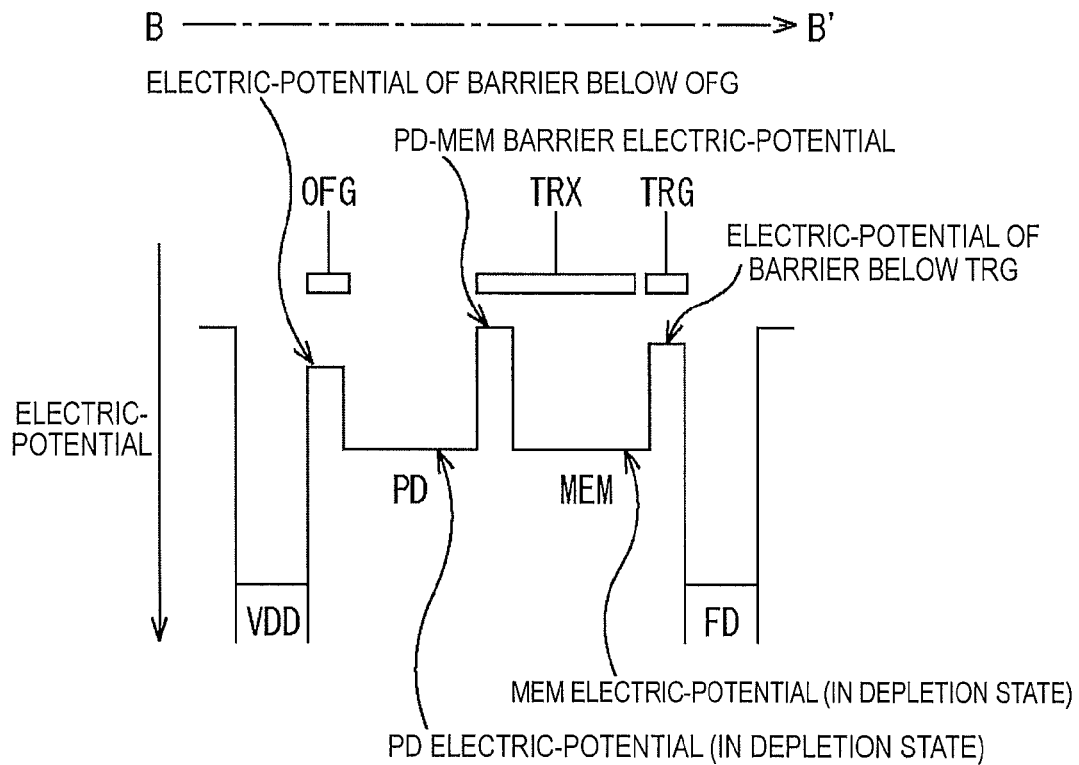
FIG. 15 is a diagram illustrating potentials on a cross-section taken along a B-B' dashed line in FIG. 14.
Figure 16:
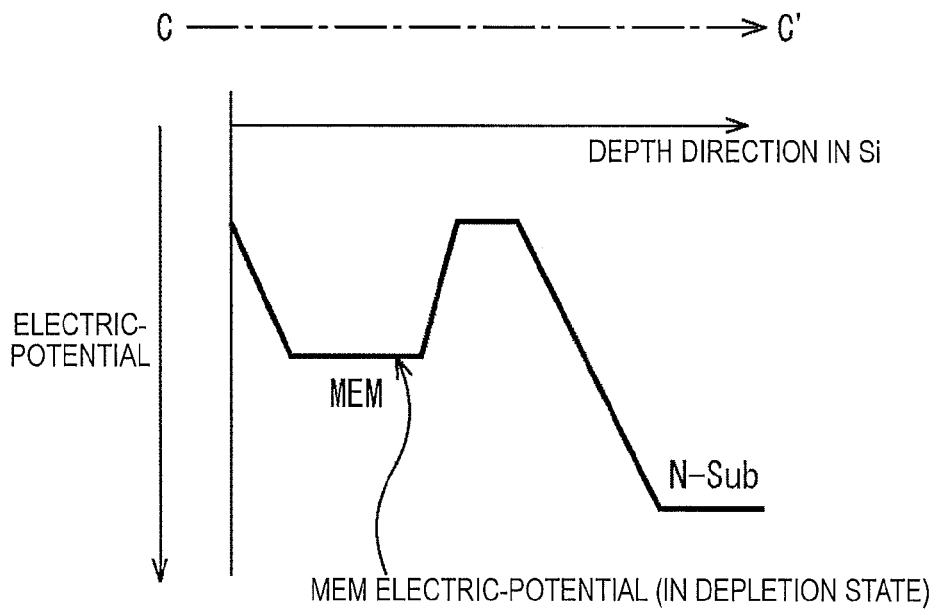
FIG. 16 is a diagram illustrating potentials on a cross-section taken along a C-C' dashed line in FIG. 14.

FIG. 14 is a cross-sectional diagram similar to FIG. 13. FIG. 15 is a diagram illustrating potentials on a cross-section taken along a B-B' dashed line in FIG. 14. FIG. 16 is a diagram illustrating potentials on a cross-section taken along a C-C' dashed line in FIG. 14.

FIG. 15 illustrates the gate electrodes of the respective OFG, the TRX, and the TRG by using horizontally long rectangles on the upper side of the figure, and schematically illustrates the degree of a potential between the PD and the MEM on the lower side of the figure. In the figure, a higher electric-potential is shown on the lower side of the figure, and a lower electric-potential is shown on the upper side.

FIG. 15 illustrates a state where the OFG, the TRX, and the TRG are turned OFF because the exposure has not been performed yet for the PD and because predetermined voltages have not been applied yet to the gate electrodes of the OFG, the TRX, and the TRG, respectively. FIG. 15 illustrates an electric-potential of the barrier below the OFG, a PD electric-potential (in depletion state), a PD-MEM barrier electric-potential, a MEM electric-potential (in depletion state), and an electric-potential of a barrier below the TRG, in this state.

In FIG. 16, the vertical axis represents an electric-potential (potential), while the horizontal axis represents a depth in the silicon (Si) substrate. As illustrated in the figure, the barrier is high (the potential is low) near the surface of the silicon substrate, the potential is high in the N-type buried channel (N) portion forming the MEM, and the barrier is high again (the potential is low) in the P-type well layer. Further, the potential is high in an N-Sub portion.

Figure 17:
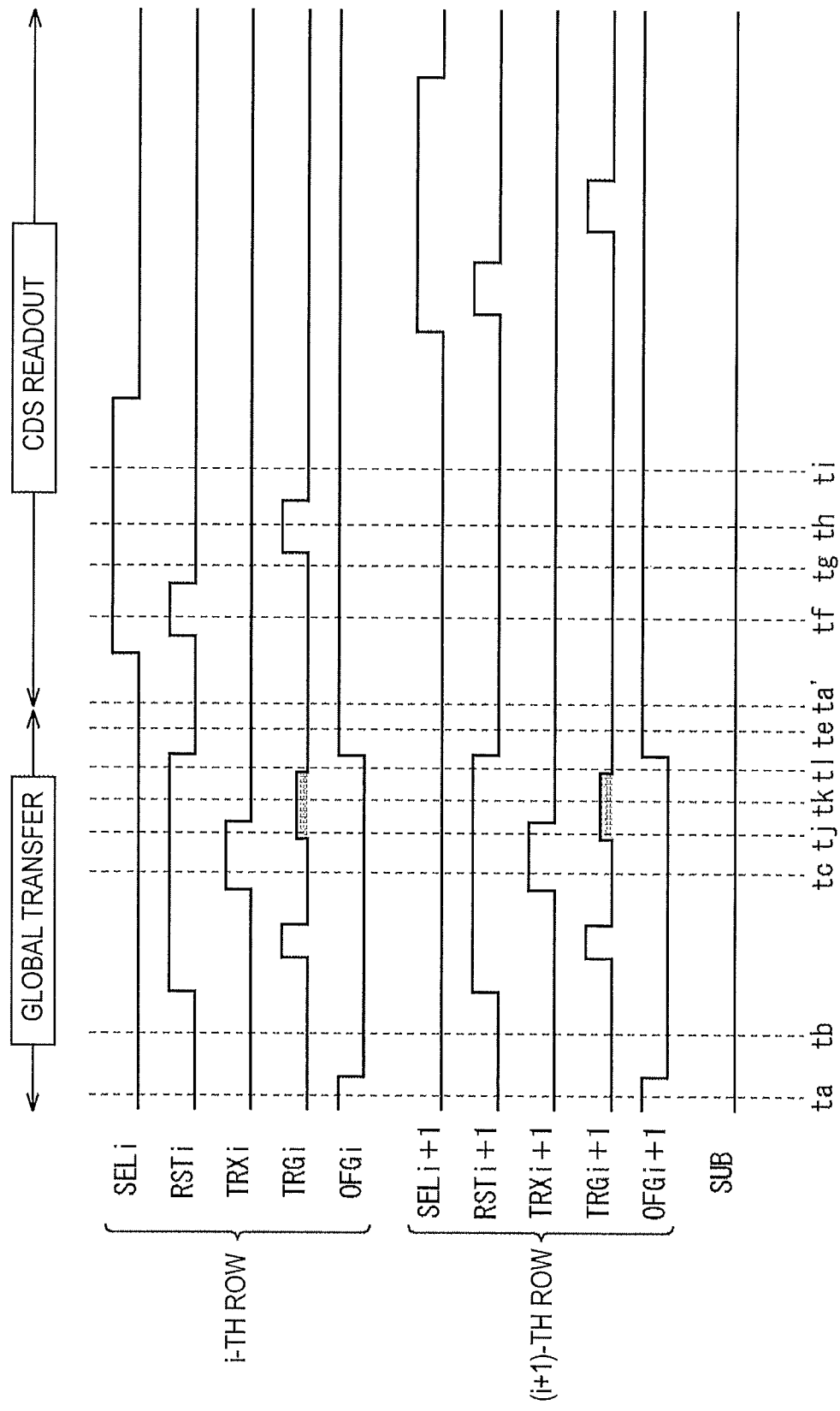
FIG. 17 is a timing chart illustrating waveforms of driving pulses in a CMOS image sensor to which the embodiment of the present technology is applied.

FIG. 17 is a timing chart illustrating waveforms of driving pulses in the global exposure operation of the CMOS image sensor 100 to which the embodiment of the present technology is applied. The figure has the horizontal axis representing time, and illustrates waveforms of the driving pulse SEL applied to the SEL 228; the driving pulse RST, to the RST 226; the driving pulse TRX, to the gate electrode of the TRX 222; the driving pulse TRG, to the gate electrode of the TRG 224; the driving pulse OFG, to the gate electrode of the OFG 229; and a pulse SUB, to an N-Sub 231. All of the parts are illustrated in FIG. 11.

Here, FIG. 17 illustrates the waveforms of the driving pulses to be applied to unit pixels in the i-th row and the (i+1)-th row among the plurality of unit pixels arranged in the matrix form. To identify each driving pulse in the rows, "i" or "i+1" is suffixed to an identification name of the pulse.

In FIG. 17, the driving pulses are inputted simultaneously to all the unit pixels in a time zone annotated by "global transfer", regardless of the row of the unit pixels. In contrast, in a time zone annotated by "CDS readout" in FIG. 17, the driving pulses are inputted to the unit pixels at different timing depending on the row.

Unlike the case of the timing chart in the related art illustrated, for example, in FIG. 3, the timing chart illustrated in FIG. 17 shows that the driving pulse TRG is formed in a time zone between time tc and time te. In other words, the driving pulse TRG is raised approximately at time tj, and the driving pulse TRG is lowered approximately at time tl.

In addition, the driving pulse TRG formed between time tj and time tl in the timing chart in FIG. 17 protrudes less than driving pulses formed before time tj and after time tl, respectively, thus being a lower driving voltage. That is, the driving voltage of the TRG applied using the driving pulse TRG formed between time tj and time tl in the timing chart in FIG. 17 is set at a voltage between a voltage at the time of driving the TRG (for example, +3V) and a voltage at the time of stopping the driving of the TRG (for example, −1V).

Such a waveform can be formed, for example, by applying a negative bias voltage weaker than an ordinary voltage when the driving pulse TRG is lowered.

The waveforms of the other driving pulses in the timing chart in FIG. 17 are the same as in the case of the timing chart in FIG. 3.

Figure 18C:
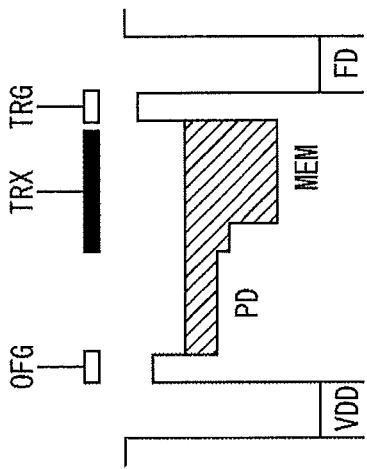
FIGS. 18A, 18B, and 18C are diagrams illustrating potentials of parts of the unit pixel at corresponding time points in FIG. 17.
Figure 18B:
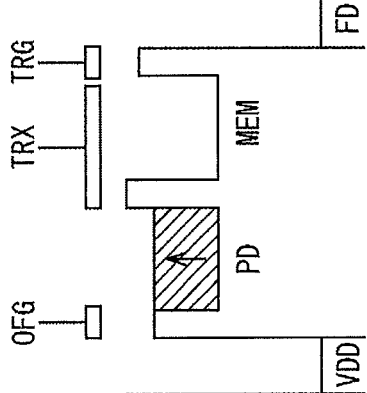
Figure 18A:
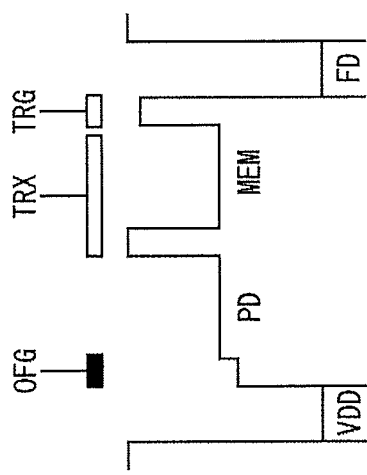
Figure 19A:
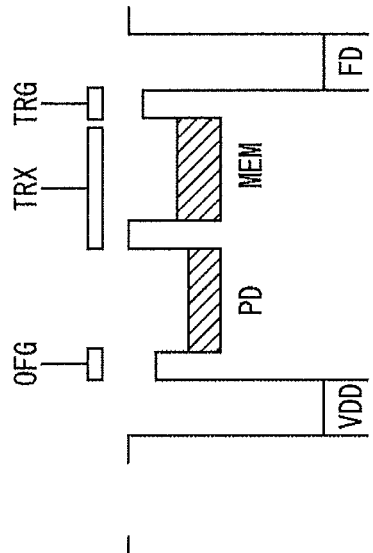
FIGS. 19A, 19B, and 19C are diagrams illustrating potentials of parts of the unit pixel at corresponding time points in FIG. 17.
Figure 19B:
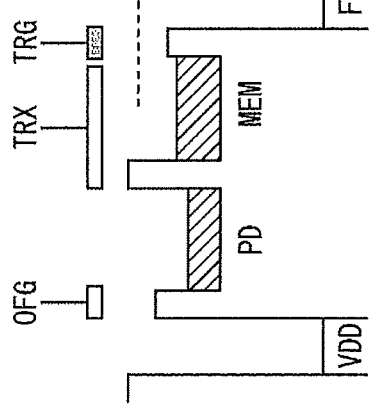
Figure 19C:
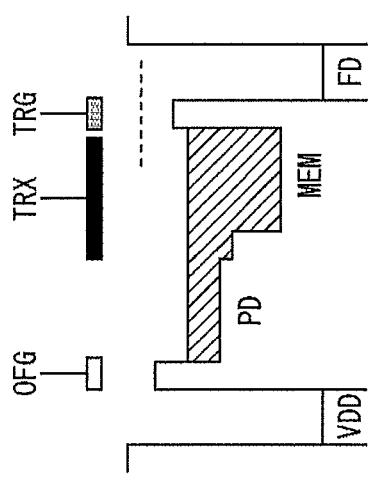
Figure 20A:
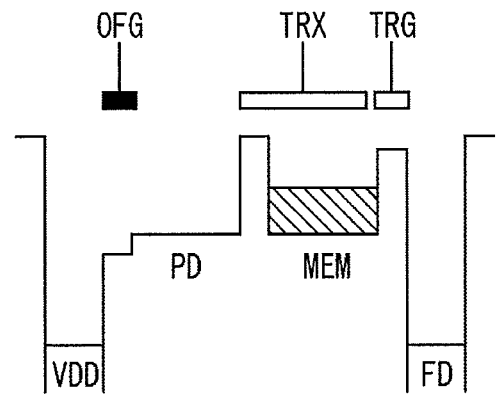
FIGS. 20A and 20B are diagrams illustrating potentials of parts of the unit pixel at corresponding time points in FIG. 17.
Figure 20B:
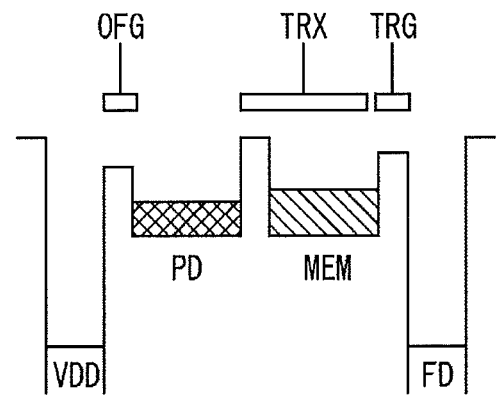

FIGS. 18 to 20 are diagrams illustrating the potentials of the parts of the unit pixel 200 in the global exposure operation. FIGS. 18A to 18C illustrate the potential of each part at the timings shown by times ta, tb, and tc in FIG. 17, respectively. FIGS. 19A to 19C illustrate the potential of the part at the timings shown by times tj, tk, and tl in FIG. 17, respectively. FIGS. 20A and 20B illustrate the potential of the part at the timings shown by times to and ta' in FIG. 17, respectively.

FIGS. 18 to 20 illustrate the gate electrodes of the respective OFG, the TRX, and the TRG by using horizontally long rectangles on the upper side of each partial figure. Black ones of these rectangles in the figures each show the gate electrode to which a driving voltage (pulse) is applied. In FIG. 19, the rectangle corresponding to the gate electrode of the TRG is hatched to thereby show that a low driving voltage (pulse) is applied thereto.

In addition, each of FIGS. 18 to 20 schematically illustrates the degree of the potential between the PD and the MEM on the lower side of the figure. In each figure, a higher electric-potential is shown on the lower side of each partial figure, and a lower electric-potential is shown on the upper side.

In executing the global exposure operation, the OFG is turned ON (driven) as illustrated in FIG. 18A to discharge the charge in the PD, so that the PD can firstly be reset simultaneously in each pixel. In FIG. 18A, when the driving voltage is applied to the OFG to turn ON the OFG, the barrier below the OFG thereby becomes low, so that the charge in the PD is discharged to the power supply VDD side.

Thereafter, as illustrated in FIG. 18B, the driving voltage (pulse) of the OFG is lowered to turn OFF the OFG, so that the simultaneous exposure is started. Thereby, the charge generated due to the photoelectric conversion in the PD is accumulated in the PD. In FIG. 18B, when the OFG is turned OFF, the barrier below the OFG becomes high to check the discharging of the charge in the PD, so that the charge is accumulated in the PD. Note that the accumulated charge is represented by oblique lines in the figure.

Upon completion of the exposure, the driving voltage is applied to the TRX simultaneously in each pixel to turn ON the TRX, as illustrated in FIG. 18C, and the charge accumulated in the PD is transferred to the MEM. In FIG. 18C, turning ON the TRX causes the barrier between the PD and the MEM below the TRX to be lower and the potential of the MEM to be deeper. Thereby, the charge accumulated in the PD is transferred to the MEM.

Thereafter, as illustrated in FIG. 19A, when a weak bias driving voltage is applied to the TRG, the barrier of the TRG thereby becomes low.

In this state, as illustrated in FIG. 19B, the driving voltage (pulse) of the TRX is lowered to turn OFF the TRX, and the charge transferred from the PD is held in the MEM. In FIG. 19B, turning OFF the TRX causes the barrier between the PD and the MEM to be high, and the charge is accumulated and held in the MEM. Note that at this time, a charge which is not completely transferred to the MEM stays in the PD.

At this time, as described above with reference to FIGS. 6 and 7, the PD-MEM barrier electric-potential and the MEM electric-potential (in depletion state) have the different degrees of change. Accordingly, the higher the voltage applied to the TRX is, the smaller the difference between the PD-MEM barrier electric-potential and the MEM electric-potential (in depletion state) is. However, according to the embodiment of the present technology, when the weak bias driving voltage is applied to the TRG, the barrier below the TRG thereby becomes low. For this reason, even if the charge held in the MEM is contaminated with a non-linear component, most of the non-linear component is discharged to the FD side. Thus, the charge held in the MEM is hardly contaminated with the non-linear component.

Thereafter, as illustrated in FIG. 19C, the driving pulse TRG is lowered to turn OFF the TRG. This causes the barrier below the TRG to be higher.

Then, as illustrated in FIG. 20A, the OFG is turned ON (driven) to discharge the charge in the PD. This prevents the charge in the PD from overflowing therefrom to flow into the MEM holding the charge (blooming) and causes resetting of the PD for the next frame.

Thereafter, as illustrated in FIG. 20B, the OFG is turned OFF to thereby start the exposure for the PD for the next frame.

Subsequently, sequential readout is performed of a reset level and a signal level. In other words, the FD is reset to read out the reset level, the charge held in the MEM is transferred to the FD, and thereafter the signal level is read out. Then, the CDS (Correlated Double Sampling) processing of subtracting reset noise from the signal level is performed, enabling processing of removing noise including the kTC noise.

By generating the driving pulses as illustrated in the timing chart in FIG. 17, it is possible to remove the non-linear component of the charge held in the MEM to check occurrence of an after-image caused by charge overflow, as described with reference to FIGS. 18 to 20.

Figure 21:
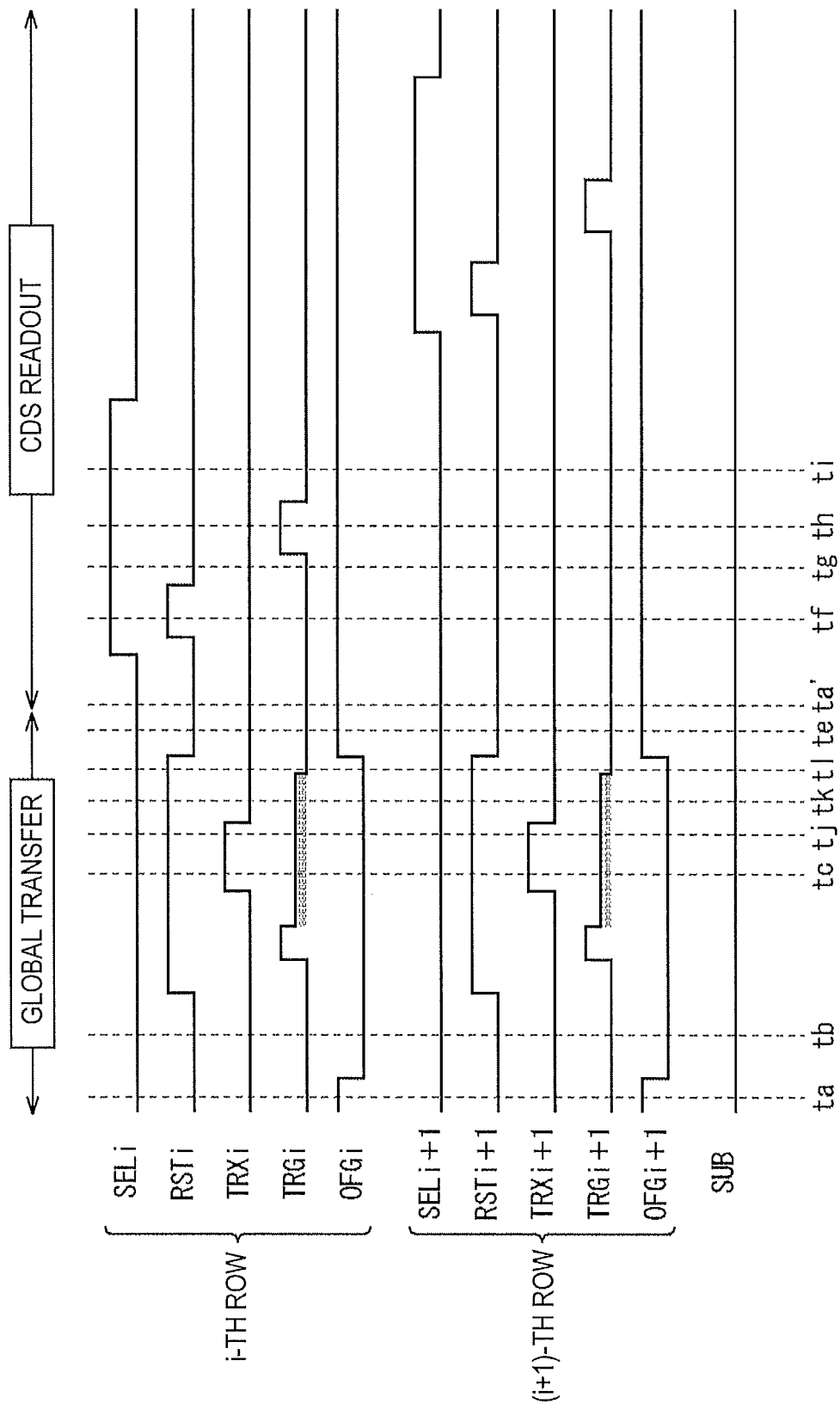
FIG. 21 is a timing chart illustrating another example of waveforms of driving pulses in a CMOS image sensor to which the embodiment of the present technology is applied.

Note that the driving pulses may be generated according to a timing chart in FIG. 21, instead of the timing chart in FIG. 17. In the timing chart in FIG. 21, time for applying the weak bias driving voltage to the TRG is set longer. In sum, a weak bias driving voltage only has to be applied to the TRG at timing when the TRX is turned OFF (the driving pulse TRX is lowered).

FIG. 22 is a timing chart illustrating still another example of the waveforms of the driving pulses in the global exposure operation of the CMOS image sensor 100. Like FIG. 17, FIG. 22 has the horizontal axis representing time, and illustrates waveforms of the driving pulse SEL applied to the SEL 228; the driving pulse RST, to the RST 226; the driving pulse TRX, to the gate electrode of the TRX 222; the driving pulse TRG, to the gate electrode of the TRG 224; the driving pulse OFG, to the gate electrode of the OFG 229; and the pulse SUB, to the N-Sub 231. All of the parts are illustrated in FIG. 11.

Here, FIG. 22 illustrates the waveforms of the driving pulses to be applied to unit pixels in the i-th row and the (i+1)-th row among the plurality of unit pixels arranged in the matrix form. To identify each driving pulse in the rows, "i" or "i+1" is suffixed to an identification name of the pulse.

Further, the driving pulses are inputted simultaneously to all the unit pixels in a time zone annotated by "global transfer", regardless of the row of the unit pixels. In contrast, in a time zone annotated by "CDS readout", the driving pulses are inputted to the unit pixels at different timing depending on the row.

Unlike the case of the timing chart in the related art illustrated, for example, in FIG. 3, the timing chart illustrated in FIG. 22 shows that a driving pulse TRG waveform protruding downward is formed in a time zone between time tc and time te. In other words, when a driving pulse TRG waveform protruding upward is lowered, a bias stronger than an ordinary negative bias is applied. Thereby, the potential of the MEM is modulated to a level shallower (lower in a viewpoint of an electric-potential) than an ordinary level. Then, the voltage applied to the TRG returns to the ordinary bias at approximately time tn.

The waveforms of the other driving pulses in the timing chart in FIG. 22 are the same as in the case of the timing chart in FIG. 3.

Figure 23A:
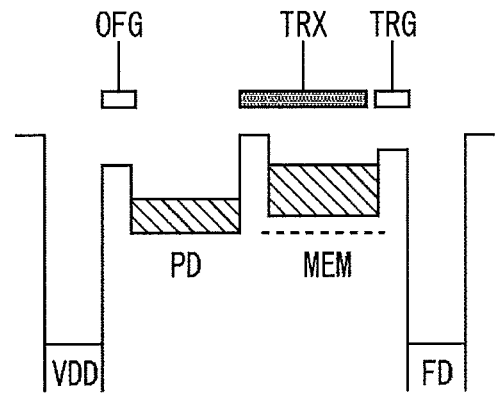
FIGS. 23A and 23B are diagrams illustrating potentials of parts of the unit pixel at corresponding time points in FIG. 22.
Figure 23B:
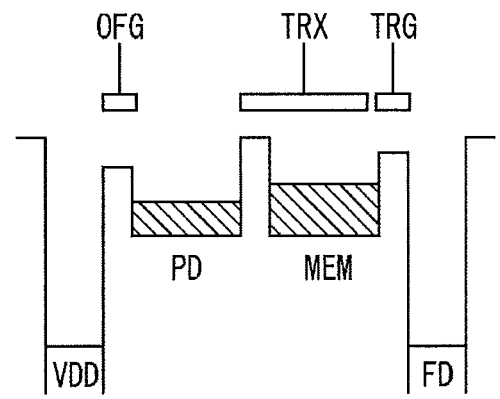

FIG. 23 is a diagram illustrating another example of the potentials of the parts of the unit pixel 200 in the global exposure operation. FIGS. 23A and 23B illustrate the potential of each part at the timings shown by times tm and tn in FIG. 22, respectively.

FIG. 23 illustrates the gate electrodes of the respective OFG, the TRX, and the TRG by using horizontally long rectangles on the upper side of each partial figure. In FIG. 23, the rectangle corresponding to the gate electrode of the TRX is hatched to thereby show that a driving voltage (pulse) of a bias stronger than an ordinary negative bias is applied thereto.

In addition, FIG. 23 schematically illustrates the degree of the potential between the PD and the MEM on the lower side of each partial figure. In the partial figure, a higher electric-potential is shown on the lower side of the figure, and a lower electric-potential is shown on the upper side.

Turning ON the TRX at time tc in FIG. 22 causes the barrier between the PD and the MEM below the TRX to be low and the potential of the MEM to be deep. Thereby, the charge accumulated in the PD is transferred to the MEM.

Then, turning OFF the TRX causes the PD-MEM barrier to be high, and a charge is accumulated and held in the MEM.

At this time, as described above with reference to FIGS. 6 and 7, the PD-MEM barrier electric-potential and the MEM electric-potential (in depletion state) have different degrees of change. Accordingly, the higher the voltage applied to the TRX is, the smaller the difference between the PD-MEM barrier electric-potential and the MEM electric-potential (in depletion state) is. However, according to the embodiment of the present technology, a driving voltage of a bias stronger than an ordinary negative bias is applied to the TRX at this time, and the potential of the MEM becomes slightly shallower, as illustrated in FIG. 23A. Note that FIG. 23A, for reference, illustrates the MEM electric-potential in the case where a driving voltage of the ordinary negative bias is applied to the TRX.

In this way, even if the charge held in the MEM is contaminated with a non-linear component, most of the non-linear component is discharged to the FD side. Thus, the charge held in the MEM is hardly contaminated with the non-linear component.

Thereafter, the driving voltage of the TRX is returned to the ordinary bias, and thereby the potential of the MEM becomes deep, as illustrated in FIG. 23B.

By generating the driving pulses as illustrated in the timing chart in FIG. 22, it is also possible to remove the non-linear component of the charge held in the MEM to check occurrence of an after-image caused by charge overflow, as described with reference to FIG. 23.

Figure 24:
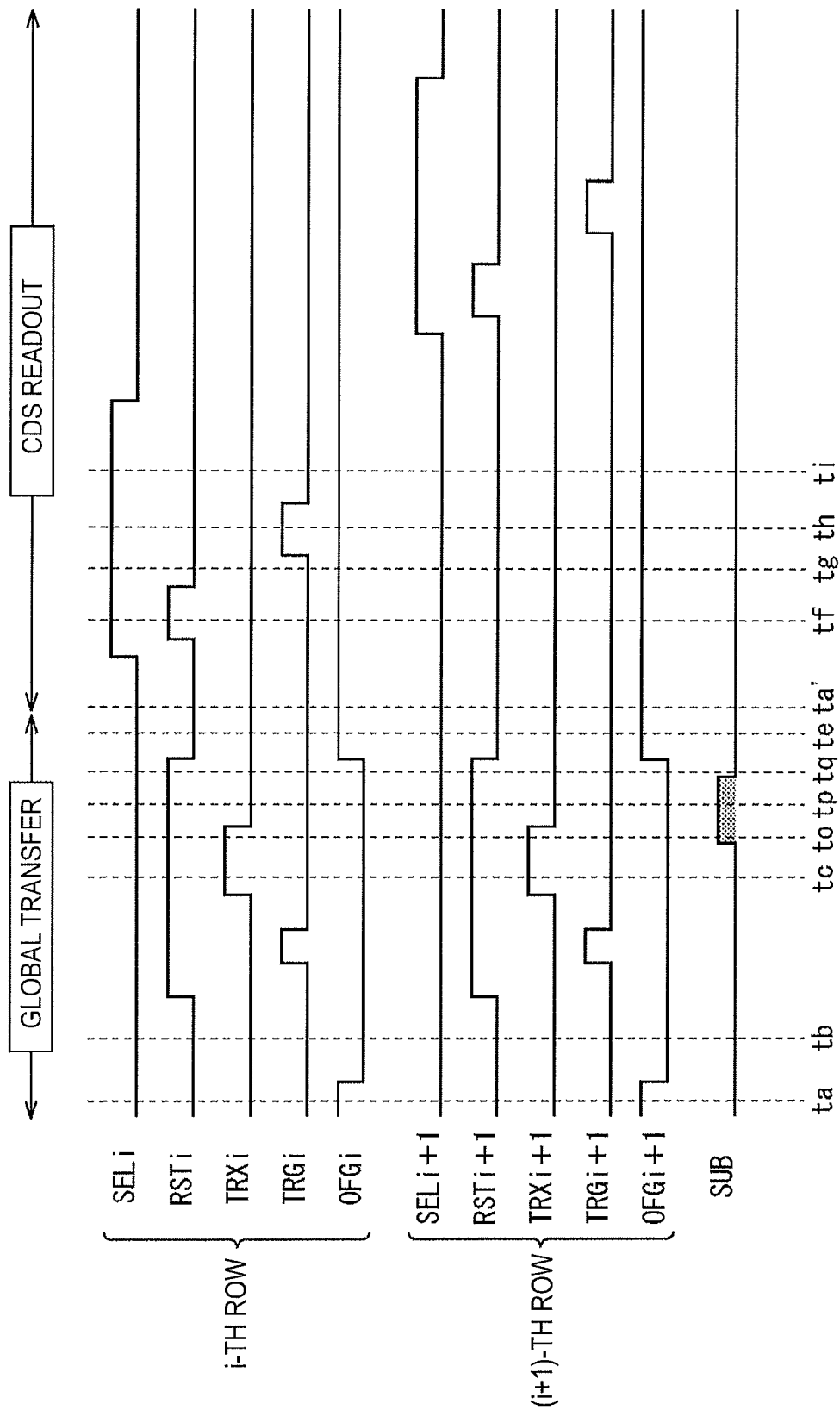
FIG. 24 is a timing chart illustrating still another example of waveforms of driving pulses in a CMOS image sensor to which the embodiment of the present technology is applied.

FIG. 24 is a timing chart illustrating yet another example of the waveforms of the driving pulses in the global exposure operation of the CMOS image sensor 100. Like FIGS. 17 and 22, FIG. 24 has the horizontal axis representing time, and illustrates waveforms of the driving pulse SEL applied to the SEL 228; the driving pulse RST, to the RST 226; the driving pulse TRX, to the gate electrode of the TRX 222; the driving pulse TRG, to the gate electrode of the TRG 224; the driving pulse OFG, to the gate electrode of the OFG 229; and the pulse SUB, to the N-Sub 231. All of the parts are illustrated in FIG. 11.

Here, FIG. 24 illustrates the waveforms of the driving pulses to be applied to unit pixels in the i-th row and the (i+1)-th row among the plurality of unit pixels arranged in the matrix form. To identify each driving pulse in the rows, "i" or "i+1" is suffixed to an identification name of the pulse.

Further, the driving pulses are inputted simultaneously to all the unit pixels in a time zone annotated by "global transfer", regardless of the row of the unit pixels. In contrast, in a time zone annotated by "CDS readout", the driving pulses are inputted to the unit pixels at different timing depending on the row.

Unlike the case of the timing chart in the related art illustrated, for example, in FIG. 3, the timing chart illustrated in FIG. 17 shows that a protruding waveform of the driving pulse SUB is formed in a time zone between time tc and time te. In other words, the upwardly protruding waveform of the driving pulse SUB is raised at time to immediately before a protruding waveform of the driving pulse TRX is lowered, and the upwardly protruding waveform of the driving pulse SUB is lowered at time tq.

In other words, while the upwardly protruding waveform of the driving pulse SUB is formed, the electric-potential of the N-Sub is high.

The waveforms of the other driving pulses in the timing chart in FIG. 24 are the same as in the case of the timing chart in FIG. 3.

FIGS. 25 to 28 are diagrams illustrating still another example of the potentials of the parts of the unit pixel 200 in the global exposure operation. FIGS. 25, 26, 27, and 28 illustrate the potential of each part at the timings shown by times tc, to, tp, and tq in FIG. 24, respectively.

Note that FIGS. 25A, 26A, 27A, and 28A are diagrams each illustrating potentials on a cross-section taken along the dashed line B-B' in FIG. 14. FIGS. 25B, 26B, 27B, and 28B are diagrams each illustrating potentials on a cross-section taken along the dashed line C-C' in FIG. 14.

FIGS. 25A, 26A, 27A, and 28A illustrate the gate electrodes of the respective OFG, the TRX, and the TRG by using horizontally long rectangles on the upper side of each figure. In each of FIGS. 25 and 26, the rectangle corresponding to the gate electrode of the TRX is shown in black to thereby show that the driving voltage (pulse) is applied thereto.

In addition, each of FIGS. 25A, 26A, 27A, and 28A schematically illustrates the degree of the potential between the PD and the MEM on the lower side of the figure. In each figure, a higher electric-potential is shown on the lower side of the figure, and a lower electric-potential is shown on the upper side.

Also in each of FIGS. 25B, 26B, 27B, and 28B, a higher electric-potential is shown on the lower side of the figure, and a lower electric-potential is shown on the upper side.

Figure 25A:
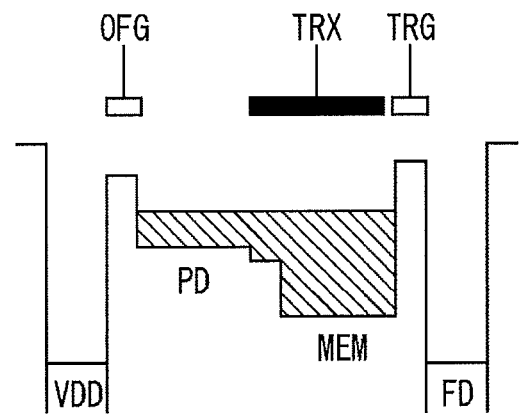
FIGS. 25A and 25B are diagrams illustrating potentials of parts of the unit pixel at corresponding time points in FIG. 24.

Upon completion of the exposure, the driving voltage is applied to the TRX simultaneously in each pixel to turn ON the TRX, as illustrated in FIG. 25A, and the charge accumulated in the PD is transferred to the MEM. In FIG. 25A, turning ON the TRX causes the barrier between the PD and the MEM below the TRX to be lower and the potential of the MEM to be deeper. Thereby, the charge accumulated in the PD is transferred to the MEM.

Figure 25B:
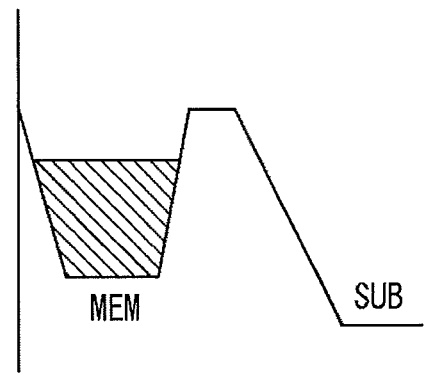

At this time, as illustrated in FIG. 25B, the barrier is high near the surface of the silicon substrate, the potential is high in the N-type buried channel (N) portion forming the MEM, and the barrier is high again in the P-type well layer. Further, the potential is high in the N-Sub portion.

Figure 26A:
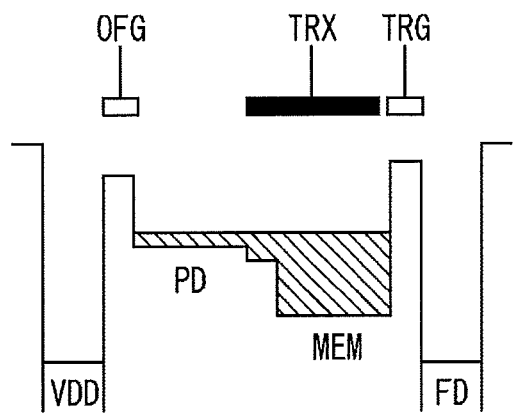
FIGS. 26A and 26B are diagrams illustrating potentials of parts of the unit pixel at corresponding time points in FIG. 24.
Figure 26B:
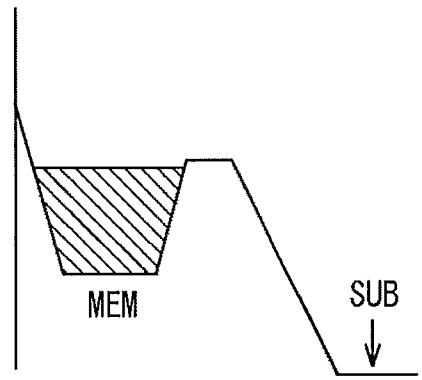

The driving pulse SUB is applied in this state, and the electric-potential of the N-Sub becomes higher. At this time, as illustrated in FIG. 26B, the barrier of the P-type well layer becomes lower, and the potential of the N-Sub portion becomes higher further.

Figure 27A:
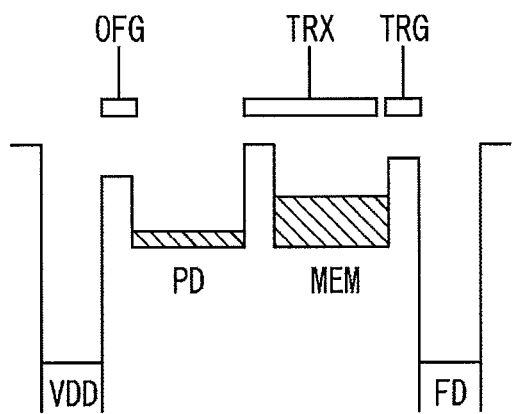
FIGS. 27A and 27B are diagrams illustrating potentials of parts of the unit pixel at corresponding time points in FIG. 24.
Figure 27B:
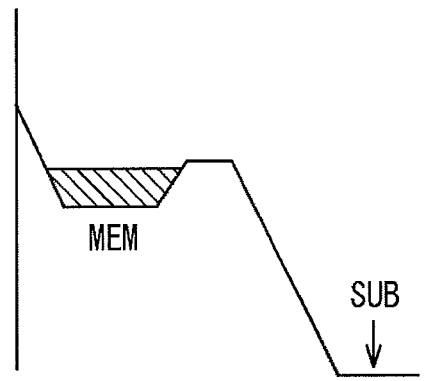

Then, when the TRX is turned OFF, the PD-MEM barrier becomes high as illustrated in FIG. 27A, so that the charge is accumulated and held in the MEM. At this time, as illustrated in FIG. 27B, while the state of the low barrier of the P-type well layer and the high potential of the N-Sub portion is maintained, the potential of the MEM becomes shallow.

At this time, as described above with reference to FIGS. 6 and 7, the PD-MEM barrier electric-potential and the MEM electric-potential (in depletion state) have the different degrees of change. Accordingly, the higher the voltage applied to the TRX is, the smaller the difference between the PD-MEM barrier electric-potential and the MEM electric-potential (in depletion state) is. However, according to the embodiment of the present technology, the driving pulse SUB is applied at this time, and thus a charge existing beyond the potential of the P-type well layer among the charges accumulated in the MEM is discharged to the N-Sub, as illustrated in FIG. 27B. For this reason, even if the charge held in the MEM is contaminated with a non-linear component, most of the non-linear component is discharged to the N-Sub. Thus, the charge held in the MEM is hardly contaminated with the non-linear component.

Figure 28A:
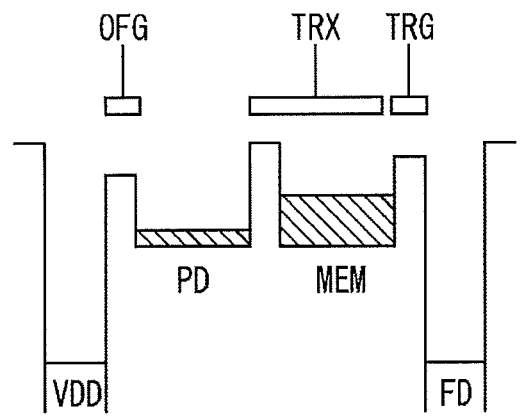
FIGS. 28A and 28B are diagrams illustrating potentials of parts of the unit pixel at corresponding time points in FIG. 24.
Figure 28B:
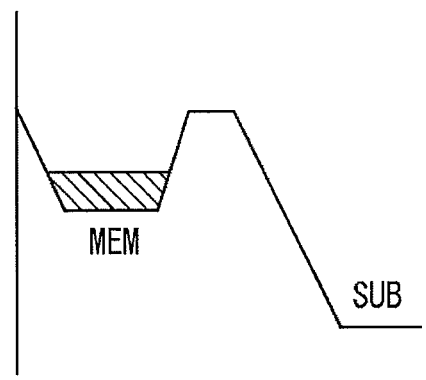

Thereafter, the driving pulse SUB is lowered in the N-Sub. As illustrated in FIG. 28B, the barrier of the P-type well layer becomes higher, and the potential of the N-Sub portion also becomes slightly higher.

By generating the driving pulses as illustrated in the timing chart in FIG. 24, it is also possible to remove the non-linear component of the charge held in the MEM to check occurrence of an after-image caused by charge overflow, as described with reference to FIGS. 25 to 28.

Note that the timing of lowering the driving pulse SUB is not limited to that illustrated in the timing chart in FIG. 24. In sum, the driving pulse SUB only has to be raised when the driving pulse TRX is lowered.

FIG. 29 is a timing chart illustrating further another example of the waveforms of the driving pulses in the global exposure operation of the CMOS image sensor 100. Like FIGS. 17, 22, and the like, FIG. 29 has the horizontal axis representing time, and illustrates waveforms of the driving pulse SEL applied to the SEL 228; the driving pulse RST, to the RST 226; the driving pulse TRX, to the gate electrode of the TRX 222; the driving pulse TRG, to the gate electrode of the TRG 224; the driving pulse OFG, to the gate electrode of the OFG 229; and the pulse SUB, to the N-Sub 231. All of the parts are illustrated in FIG. 11.

Here, FIG. 29 illustrates the waveforms of the driving pulses to be applied to unit pixels in the i-th row and the (i+1)-th row among the plurality of unit pixels arranged in the matrix form. To identify each driving pulse in the rows, "i" or "i+1" is suffixed to an identification name of the pulse.

Further, the driving pulses are inputted simultaneously to all the unit pixels in a time zone annotated by "global transfer", regardless of the row of the unit pixels. In contrast, in a time zone annotated by "CDS readout", the driving pulses are inputted to the unit pixels at different timing depending on the row.

Unlike the case of the timing chart in the related art illustrated, for example, in FIG. 3, the timing chart illustrated in FIG. 29 shows that in a time zone between time tc and time te, the driving pulse OFG is raised before the upwardly protruding waveform of the driving pulse TRX is raised. In other words, at time tr immediately before the upwardly protruding waveform of the driving pulse TRX is lowered, the driving pulse OFG is raised.

The waveforms of the other driving pulses in the timing chart in FIG. 29 are the same as in the case of the timing chart in FIG. 3.

Figure 30C:
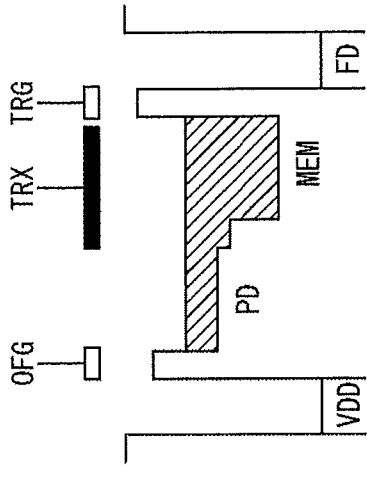
FIGS. 30A, 30B, and 30C are diagrams illustrating potentials of parts of the unit pixel at corresponding time points in FIG. 29.
Figure 30B:
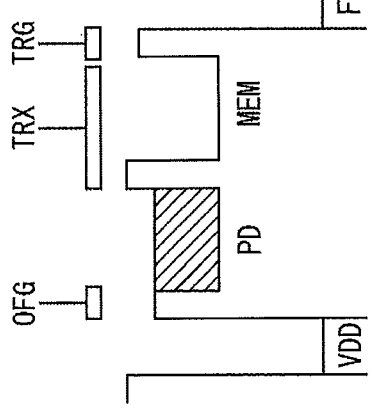
Figure 30A:
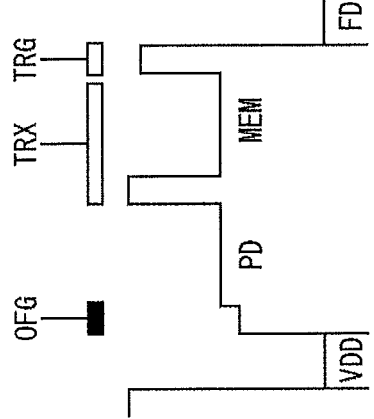
Figure 31A:
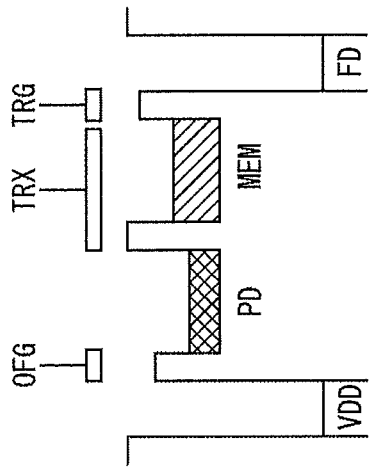
FIGS. 31A, 31B, and 31C are diagrams illustrating potentials of parts of the unit pixel at corresponding time points in FIG. 29.
Figure 31B:
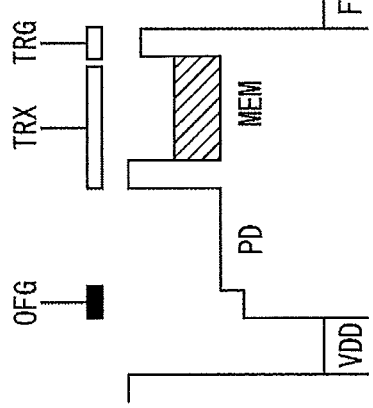
Figure 31C:
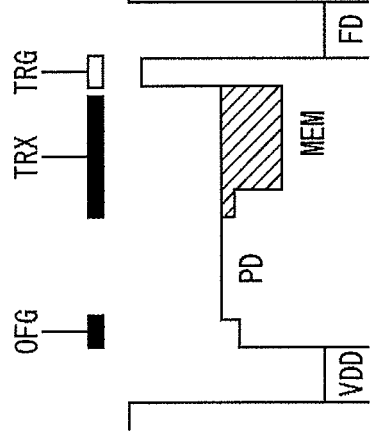

FIGS. 30 and 31 are diagrams illustrating yet another example of the potentials of the parts of the unit pixel 200 in the global exposure operation. FIGS. 30A, 30B, and 30C illustrate the potential of each part at the timings shown by times ta, tb, and tc in FIG. 29, respectively. FIGS. 31A, 31B, and 31C illustrate the potential of the part at the timings shown by times tr, te, and ta' in FIG. 29, respectively.

Each of FIGS. 30 and 31 illustrates the gate electrodes of the respective OFG, the TRX, and the TRG by using horizontally long rectangles on the upper side of each partial figure. Each rectangle corresponding to the gate electrode of the TRX is shown in black to thereby show that the driving voltage (pulse) is applied thereto.

In addition, each of FIGS. 30 and 31 schematically illustrates the degree of the potential between the PD and the MEM on the lower side of each partial figure thereof. In the partial figure, a higher electric-potential is shown on the lower side of the partial figure, and a lower electric-potential is shown on the upper side.

In executing the global exposure operation, the OFG is turned ON (driven) as illustrated in FIG. 30A to discharge the charge in the PD, so that the PD can firstly be reset simultaneously in each pixel. In FIG. 30A, when the driving voltage is applied to the OFG to turn ON the OFG, the barrier below the OFG thereby becomes low, so that the charge in the PD is discharged to the power supply VDD side.

Thereafter, as illustrated in FIG. 30B, the driving voltage (pulse) of the OFG is lowered to turn OFF the OFG, so that the simultaneous exposure is started. Thereby, the charge generated due to the photoelectric conversion in the PD is accumulated in the PD. In FIG. 30B, when the OFG is turned OFF, the barrier below the OFG becomes high to check the discharging of the charge in the PD, so that the charge is accumulated in the PD. Note that the accumulated charge is represented by oblique lines in the figure.

Upon completion of the exposure, the driving voltage is applied to the TRX simultaneously in each pixel to turn ON the TRX, as illustrated in FIG. 30C, and the charge accumulated in the PD is transferred to the MEM. In FIG. 30C, turning ON the TRX causes the barrier between the PD and the MEM below the TRX to be lower and the potential of the MEM to be deeper. Thereby, the charge accumulated in the PD is transferred to the MEM.

Thereafter, as illustrated in FIG. 31A, the driving pulse OFG is applied to turn ON the OFG. The barrier below the OFG thereby becomes low, so that the charge in the PD is discharged to the power supply VDD side.

In this state, as illustrated in FIG. 31B, the driving voltage (pulse) of the TRX is lowered to turn OFF the TRX, and the charge transferred from the PD is held in the MEM. In FIG. 31B, turning OFF the TRX causes the barrier between the PD and the MEM to be high, and the charge is accumulated and held in the MEM.

At this time, as described above with reference to FIGS. 6 and 7, the PD-MEM barrier electric-potential and the MEM electric-potential (in depletion state) have the different degrees of change. Accordingly, the higher the voltage applied to the TRX is, the smaller the difference between the PD-MEM barrier electric-potential and the MEM electric-potential (in depletion state) is. However, according to the embodiment of the present technology, turning ON the OFG before this causes the barrier below the OFG to be low. For this reason, the charge held in the MEM is not contaminated with the non-linear component, and a charge corresponding to the non-linear component is discharged to the VDD side. Thus, the charge held in the MEM is not contaminated with the non-linear component.

Thereafter, as illustrated in FIG. 31C, the OFG is turned OFF to start the exposure for the PD for the next frame.

By generating the driving pulses as illustrated in the timing chart in FIG. 29, it is also possible to remove the non-linear component of the charge held in the MEM to check occurrence of an after-image caused by charge overflow, as described with reference to FIGS. 30 and 31.

Figure 32:
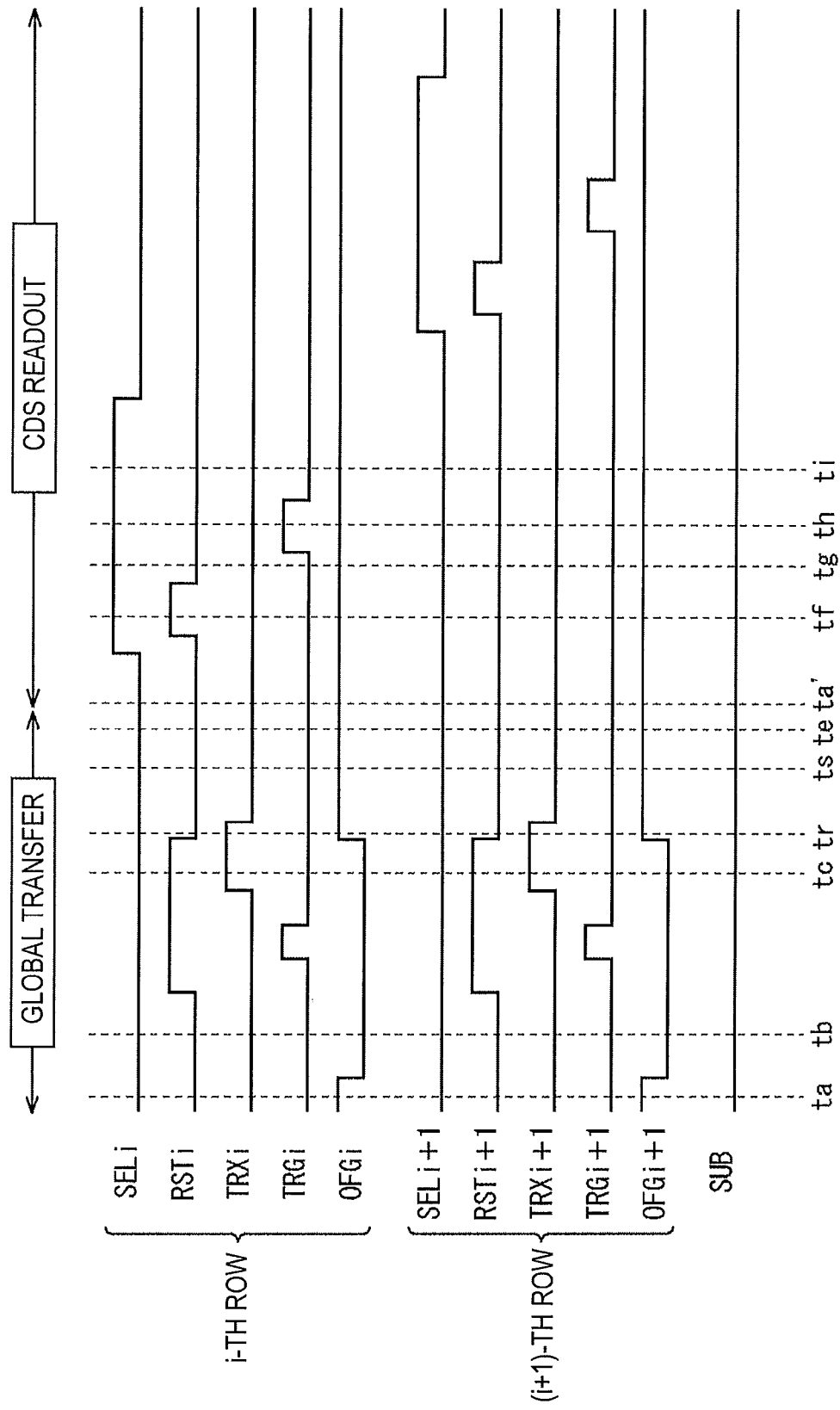
FIG. 32 is a timing chart illustrating still another example of waveforms of driving pulses in a CMOS image sensor to which the embodiment of the present technology is applied.

Note that the driving pulses may be generated according to a timing chart in FIG. 32, instead of the timing chart in FIG. 29. In the timing chart in FIG. 32, timing of raising the driving pulse OFG and timing of lowering the driving pulse RST approximately coincide with each other.

Since each pixel has the same exposure time in the global exposure operation, the OFG is driven simultaneously in each pixel. In this respect, there is a concern about an impact of coupling with the driving of the OFG on another signal line or the like. Hence, as illustrated in FIG. 32, the driving pulse RST is lowered at the same time as the driving pulse OFG is raised, and thus the variation due to coupling is cancelled. This makes it possible to reduce malfunctions due to the coupling (for example, horizontal stripes due to power supply fluctuation).

Figure 33:
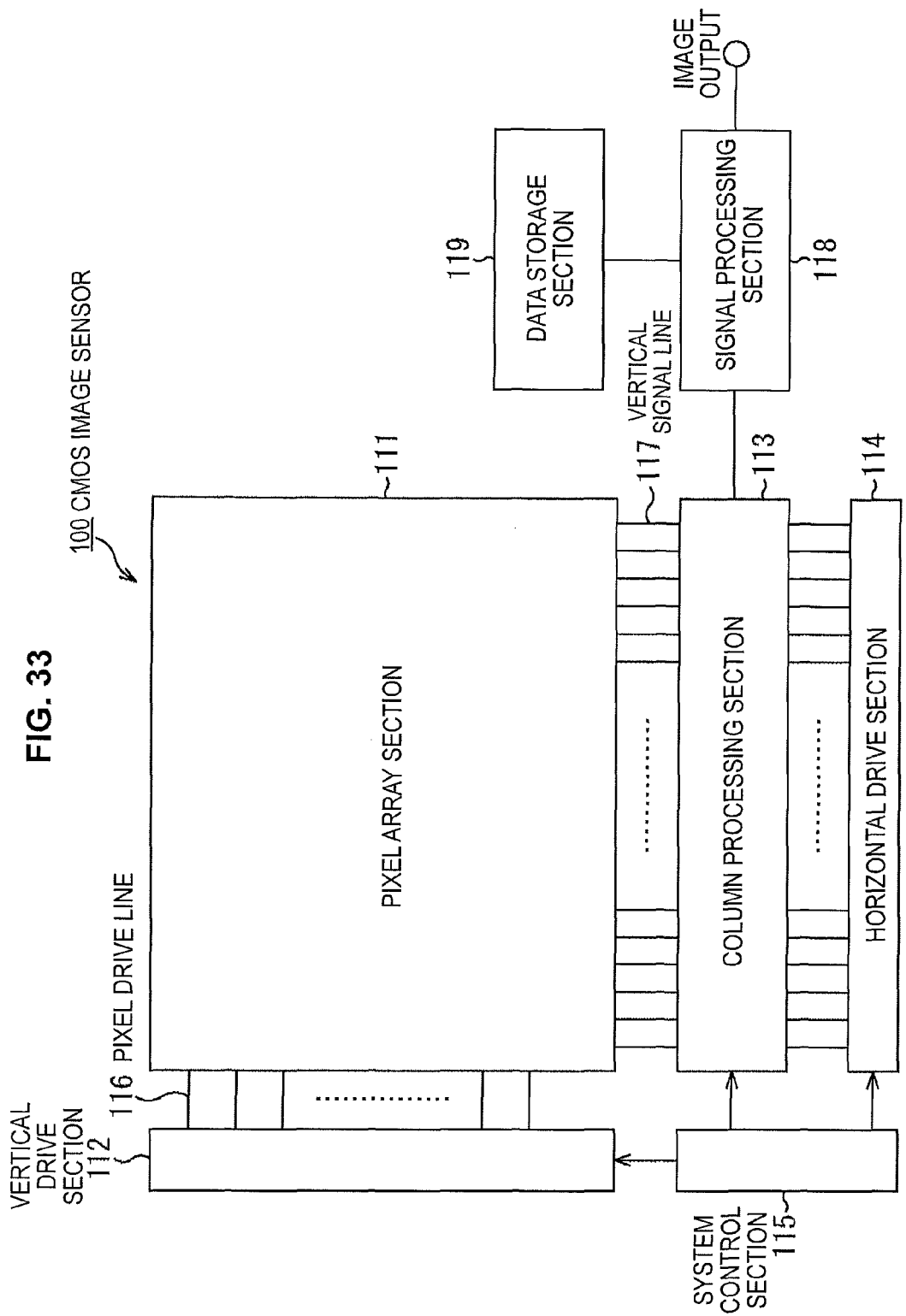
FIG. 33 is a diagram illustrating another configuration example of the solid-state imaging device to which the embodiment of the present technology is applied.

Meanwhile, instead of the configuration in FIG. 10, a configuration in FIG. 33 may be employed as the configuration example of the CMOS image sensor to which the embodiment of the present technology is applied. FIG. 33 is a system configuration diagram illustrating another schematic configuration example of the solid-state imaging device including the solid-state image sensor to which the embodiment of the present technology is applied.

In the configuration in FIG. 33, the data storage section 119 is provided in parallel with the column processing section 113. This enables horizontal scanning readout by the horizontal drive section 114 and execution of signal processing by the signal processing section 118 in the subsequent stage.

Figure 34:
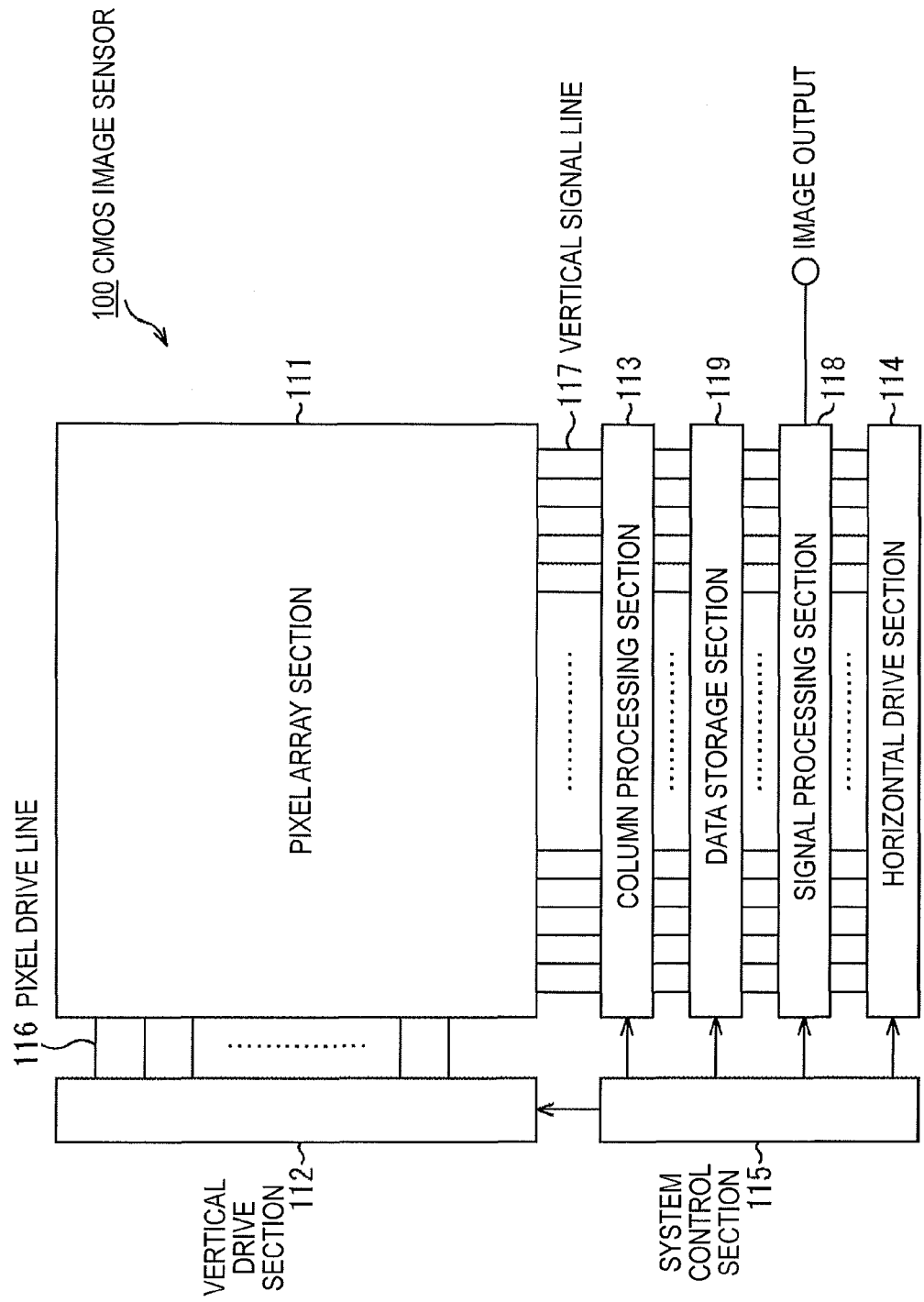
FIG. 34 is a diagram illustrating still another configuration example of the solid-state imaging device to which the embodiment of the present technology is applied.

Further, instead of the configuration in FIG. 10, a configuration in FIG. 34 may be employed as the configuration example of the CMOS image sensor to which the embodiment of the present technology is applied. FIG. 34 is a system configuration diagram illustrating still another schematic configuration example of the solid-state imaging device including the solid-state image sensor to which the embodiment of the present technology is applied.

In the configuration illustrated in FIG. 34, still another configuration may be employed in which the column processing section 113 is provided with an AD conversion function of performing AD conversion for each column or each column group of the pixel array section 111, and in which the data storage section 119 and the signal processing section 118 are provided in parallel with the column processing section 113. With the configuration, the signal processing section 118 performs signal removing processing in an analog or digital manner, and thereafter the data storage section 119 and the signal processing section 118 execute processing thereof for each column or each column group.

Note that application of the present technology is not limited to the application to the solid-state image sensor, such as a CMOS image sensor. That is, the present technology is applicable to a general electronic device using a solid-state image sensor for an image capturing section (a photoelectric conversion section), the general electronic device including an imaging apparatus such as a digital still camera or a video camera, a mobile terminal device having an image capturing function, a copier using a solid-state image sensor for an image reading section, and the like. The solid-state image sensor may be formed as one chip, may be in a form in which a plurality of chips are accumulated or contiguous to each other, or may be formed as a module having an image capturing function in which an image capturing section and either a signal processing section or an optical system are packaged together.

Figure 35:
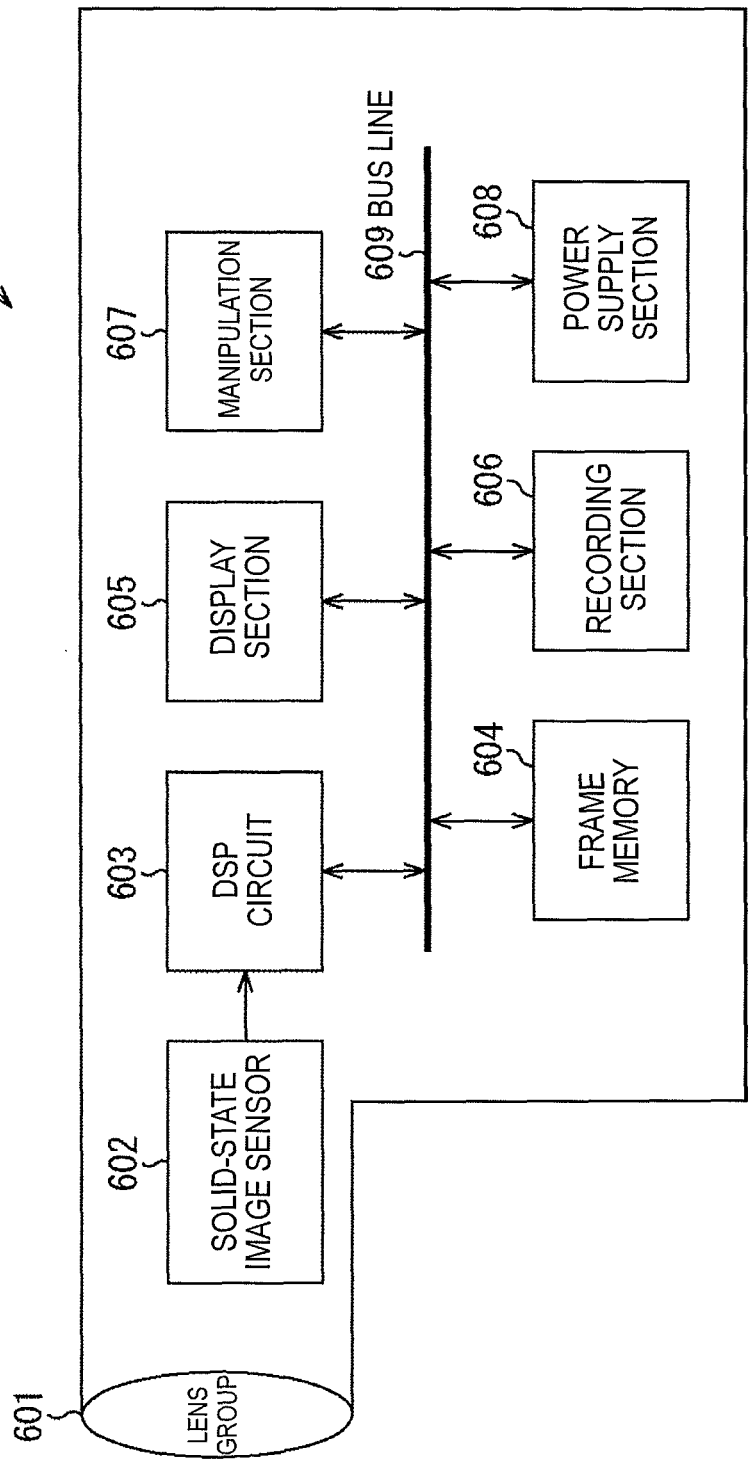
FIG. 35 is a block diagram illustrating a configuration example of an imaging apparatus serving as an electronic device to which the embodiment of the present technology is applied.

FIG. 35 is a block diagram of a configuration example of an imaging apparatus serving as an electronic device to which the present technology is applied.

An imaging apparatus 600 in FIG. 35 includes: a lens group 601 formed by a lens group or the like; a solid-state image sensor (an image-capturing device) 602 employing the aforementioned configuration of the pixels 2, and a DSP (Digital Signal Processor) circuit 603 which is a camera signal processing circuit. The imaging apparatus 600 also includes a frame memory 604, a display section 605, a recording section 606, a manipulation section 607, and a power supply section 608. The DSP circuit 603, the frame memory 604, the display section 605, the recording section 606, the manipulation section 607, and the power supply section 608 are connected to each other via a bus line 609.

The optical section 601 takes in incident light (image light) from a subject to form an image on an imaging surface of the solid-state image sensor 602. The solid-state image sensor 602 converts a light amount of incident light into an electrical signal on a pixel basis and outputs the electrical signal, the incident light being used for forming the image on the imaging surface by the optical section 601. It is possible to use, as the solid-state image sensor 602, a solid-state image sensor such as the CMOS image sensor 100 according to the aforementioned embodiment which is arranged on the CMOS image sensor, that is, a solid-state image sensor which makes it possible to capture an image without distortion by using global exposure.

The display section 605 includes a panel display device such as a liquid crystal panel or an organic EL (Electro Luminescence) panel, and displays a moving image or a still image captured by the solid-state image sensor 602. The recording section 606 records the moving image or the still image captured by the solid-state image sensor 602 in a recording medium such as a video tape or a DVD (Digital Versatile Disk).

The manipulation section 607 issues manipulation instructions for various functions of the imaging apparatus 600 in accordance with user's manipulation. The power supply section 608 appropriately supplies the DSP circuit 603, the frame memory 604, the display section 605, the recording section 606, and the manipulation section 607 with power to cause these sections to operate.

In addition, the aforementioned embodiment has been described by taking as an example the case where the present technology is applied to the CMOS image sensor including the unit pixels arranged in a matrix form, the unit pixels each sensing, as a physical quantity, a signal charge corresponding to a light amount of visible light. The application of the present technology, however, is not limited to the application to the CMOS image sensor. The present technology is applicable to a general column-system solid-state image sensor including a column processing section arranged for each pixel column in a pixel array section.

The application of the present technology is not limited to the application to the solid-state image sensor which captures an image by sensing distribution of incident light amounts of visible light. The present technology is also applicable to: a solid-state image sensor which captures an image based on distribution of incidence amounts of infrared rays, X-rays, particles or the like; and a general solid-state image sensor in a broad sense (a physical-quantity distribution sensing device) such as a fingerprint detection sensor which captures an image by sensing distribution of other physical quantities such as pressures or electrostatic capacitances.

It should be also noted that, in this specification, the steps describing the program stored in the recording medium include not only a process performed in time series according to the sequence shown therein but also a process executed in parallel or individually, not necessarily performed in time series.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A solid-state image sensor including:
a photoelectric conversion part which generates a charge corresponding to received light and accumulates the charge therein;
a charge holding part in which before the charge accumulated in the photoelectric conversion part is transferred to a floating diffusion region, the charge is held for a predetermined time;
a first transfer gate which transfers the charge accumulated in the photoelectric conversion part to the charge holding part;
a second transfer gate which transfers the charge held in the charge holding part to the floating diffusion region; and
a charge discharging gate which discharges the charge in the photoelectric conversion part,
wherein, before charge accumulation in the photoelectric conversion part for the next frame is started, part of the charge accumulated in the charge holding part is discharged.

(2) The solid-state image sensor according to (1),
wherein in order to transfer the charge accumulated in the photoelectric conversion part to the charge holding part, a driving voltage is applied to the charge discharging gate when a driving voltage is applied to the first transfer gate.

(3) The solid-state image sensor according to (2), further including:
a reset transistor which resets the charge accumulated in the floating diffusion region,
wherein a driving pulse for the charge discharging gate is raised concurrently with lowering a driving pulse for the reset transistor.

(4) The solid-state image sensor according to (1),
wherein after the charge accumulated in the photoelectric conversion part is transferred to the charge holding part by driving the first transfer gate, a value of a voltage applied to the second transfer gate is set at an intermediate value between values of a voltage at a time of driving and a voltage at a time of driving stop.

(5) The solid-state image sensor according to (4),
wherein the value of the voltage applied to the second transfer gate at a time of lowering a driving pulse of a driving voltage of the first transfer gate is the intermediate value between the values of the voltage at the time of driving and the voltage at the time of driving stop.

(6) The solid-state image sensor according to (1),
wherein after the charge accumulated in the photoelectric conversion part is transferred to the charge holding part by driving the first transfer gate, a value of a voltage applied to the first transfer gate is set at a lower value at a time of driving stop.

(7) The solid-state image sensor according to (1), further including:
an N-type substrate disposed as a layer which is below the photoelectric conversion part and the charge holding part,
wherein a voltage is applied in a manner that an electric-potential of the N-type substrate becomes high when a driving pulse for the first transfer gate is lowered.

(8) A driving method for a solid-state image sensor including a photoelectric conversion part which generates a charge corresponding to received light and accumulates the charge therein, a charge holding part in which before the charge accumulated in the photoelectric conversion part is transferred to a floating diffusion region, the charge is held for a predetermined time, a first transfer gate which transfers the charge accumulated in the photoelectric conversion part to the charge holding part, a second transfer gate which transfers the charge held in the charge holding part to the floating diffusion region, and a charge discharging gate which discharges the charge in the photoelectric conversion part, the driving method including:
before charge accumulation in the photoelectric conversion part for the next frame is started, discharging part of the charge accumulated in the charge holding part.

(9) An electronic device including:
a solid-state image sensor including
a photoelectric conversion part which generates a charge corresponding to received light and accumulates the charge therein,
a charge holding part in which before the charge accumulated in the photoelectric conversion part is transferred to a floating diffusion region, the charge is held for a predetermined time,
a first transfer gate which transfers the charge accumulated in the photoelectric conversion part to the charge holding part,
a second transfer gate which transfers the charge held in the charge holding part to the floating diffusion region, and
a charge discharging gate which discharges the charge in the photoelectric conversion part, wherein, before charge accumulation in the photoelectric conversion part for the next frame is started, part of the charge accumulated in the charge holding part is discharged.

The present disclosure contains subject matter related to that disclosed in Japanese Priority Patent Application JP 2012-208322 filed in the Japan Patent Office on Sep. 21, 2012, the entire content of which is hereby incorporated by reference.

What is claimed is:

1. A solid-state image sensor comprising:
a photoelectric conversion part which generates a charge corresponding to received light and accumulates the charge therein;
a charge holding part in which before the charge accumulated in the photoelectric conversion part is transferred to a floating diffusion region, the charge is held for a predetermined time;
a first transfer gate which transfers the charge accumulated in the photoelectric conversion part to the charge holding part;
a second transfer gate which transfers the charge held in the charge holding part to the floating diffusion region; and
a charge discharging gate which discharges the charge in the photoelectric conversion part,
wherein, before charge accumulation in the photoelectric conversion part for the next frame is started, part of the charge accumulated in the charge holding part is discharged.

2. The solid-state image sensor according to claim 1, wherein in order to transfer the charge accumulated in the photoelectric conversion part to the charge holding part, a driving voltage is applied to the charge discharging gate when a driving voltage is applied to the first transfer gate.

3. The solid-state image sensor according to claim 2, further comprising:
a reset transistor which resets the charge accumulated in the floating diffusion region,
wherein a driving pulse for the charge discharging gate is raised concurrently with lowering a driving pulse for the reset transistor.

4. The solid-state image sensor according to claim 1, wherein after the charge accumulated in the photoelectric conversion part is transferred to the charge holding part by driving the first transfer gate, a value of a voltage applied to the second transfer gate is set at an intermediate value between values of a voltage at a time of driving and a voltage at a time of driving stop.

5. The solid-state image sensor according to claim 4, wherein the value of the voltage applied to the second transfer gate at a time of lowering a driving pulse of a driving voltage of the first transfer gate is the intermediate value between the values of the voltage at the time of driving and the voltage at the time of driving stop.

6. The solid-state image sensor according to claim 1, wherein after the charge accumulated in the photoelectric conversion part is transferred to the charge holding part by driving the first transfer gate, a value of a voltage applied to the first transfer gate is set at a lower value at a time of driving stop.

7. The solid-state image sensor according to claim 1, further comprising:
an N-type substrate disposed as a layer which is below the photoelectric conversion part and the charge holding part,
wherein a voltage is applied in a manner that an electric-potential of the N-type substrate becomes high when a driving pulse for the first transfer gate is lowered.

8. A driving method for a solid-state image sensor including a photoelectric conversion part which generates a charge corresponding to received light and accumulates the charge therein, a charge holding part in which before the charge accumulated in the photoelectric conversion part is transferred to a floating diffusion region, the charge is held for a predetermined time, a first transfer gate which transfers the charge accumulated in the photoelectric conversion part to the charge holding part, a second transfer gate which transfers the charge held in the charge holding part to the floating diffusion region, and a charge discharging gate which discharges the charge in the photoelectric conversion part, the driving method comprising:
before charge accumulation in the photoelectric conversion part for the next frame is started, discharging part of the charge accumulated in the charge holding part.

9. An electronic device comprising:
a solid-state image sensor including
a photoelectric conversion part which generates a charge corresponding to received light and accumulates the charge therein,
a charge holding part in which before the charge accumulated in the photoelectric conversion part is transferred to a floating diffusion region, the charge is held for a predetermined time,
a first transfer gate which transfers the charge accumulated in the photoelectric conversion part to the charge holding part,
a second transfer gate which transfers the charge held in the charge holding part to the floating diffusion region, and
a charge discharging gate which discharges the charge in the photoelectric conversion part,
wherein, before charge accumulation in the photoelectric conversion part for the next frame is started, part of the charge accumulated in the charge holding part is discharged.

* * * * *